United States Patent
Sugito

(10) Patent No.: US 9,865,562 B2
(45) Date of Patent: Jan. 9, 2018

(54) BONDING DEVICE

(71) Applicant: KAIJO CORPORATION, Tokyo (JP)

(72) Inventor: Akio Sugito, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 0 days.

(21) Appl. No.: 15/104,410

(22) PCT Filed: Feb. 19, 2015

(86) PCT No.: PCT/JP2015/054607
§ 371 (c)(1),
(2) Date: Jun. 14, 2016

(87) PCT Pub. No.: WO2015/170498
PCT Pub. Date: Nov. 12, 2015

(65) Prior Publication Data
US 2017/0005065 A1    Jan. 5, 2017

(30) Foreign Application Priority Data
May 9, 2014    (JP) .................................. 2014-098057

(51) Int. Cl.
*B23K 37/00*    (2006.01)
*H01L 23/00*    (2006.01)
(Continued)

(52) U.S. Cl.
CPC ............ *H01L 24/78* (2013.01); *B23K 20/005* (2013.01); *B23K 20/02* (2013.01); *B23K 20/106* (2013.01);
(Continued)

(58) Field of Classification Search
CPC ........... H01L 24/78; H01L 2224/78824; H01L 2224/78349; H01L 2924/00014;
(Continued)

(56) References Cited

U.S. PATENT DOCUMENTS 5,275,324 A    1/1994 Yamazaki et al.
5,890,643 A    4/1999 Razon
(Continued)

FOREIGN PATENT DOCUMENTS

JP    05090321 A  *  4/1993
JP    5275502 A2    10/1993

OTHER PUBLICATIONS

International Search Report dated May 19, 2015 filed in PCT/JP2015/054607.

*Primary Examiner* — Kiley Stoner
(74) *Attorney, Agent, or Firm* — Rankin, Hill & Clark LLP

(57) ABSTRACT

To provide a bonding device capable of adequately controlling a leading end of a capillary when a ball formed at a leading end of a wire is pressed and bonded to an electrode of a semiconductor chip with scrub vibration. The bonding device is provided with a vibration driving portion (7), the vibration driving portion (7) including a plurality of piezoelectric elements (10) that are expanded and contracted along an axial direction of a bonding arm (3) respectively with one end thereof fixed to a leading end of the bonding arm (3), a plurality of capillary holding portions (15) that are in contact respectively with a circumferential face of a capillary (20) at a base end side thereof as being fixed correspondingly to the other end of the piezoelectric elements (10), and a pressing-holding portion (21) that sandwiches the capillary (20) as pressing the capillary (20) to the capillary holding portions (15) with at least one end side fixed to the bonding arm (3) and the other end side being in contact with the circumferential face of the capillary (20) at the base end side thereof on a side opposite to the capillary holding portions (15). Here, functional operation of ampli-
(Continued)

tude, phase, frequency, or waveform is performed on drive voltage waveform to the respective piezoelectric elements.

13 Claims, 19 Drawing Sheets

(51) Int. Cl.
    *B23K 20/00*      (2006.01)
    *B23K 20/02*      (2006.01)
    *B23K 20/10*      (2006.01)

(52) U.S. Cl.
    CPC ........... *H01L 2224/78301* (2013.01); *H01L 2224/78349* (2013.01); *H01L 2224/78824* (2013.01); *H01L 2924/00014* (2013.01)

(58) Field of Classification Search
    CPC ......... H01L 2224/78301; H01L 24/85; H01L 24/86; B23K 20/106; B23K 20/02; B23K 20/005; B23K 20/007
    USPC ............. 228/180.5, 110.1, 1.1, 904, 4.5
    See application file for complete search history.

(56) References Cited

U.S. PATENT DOCUMENTS

| | | | | |
|---|---|---|---|---|
| 6,578,753 | B1 * | 6/2003 | Sakakura | B06B 3/00 156/580.1 |
| 2003/0062395 | A1 * | 4/2003 | Li | B23K 20/106 228/4.5 |
| 2004/0007609 | A1 * | 1/2004 | Kyomasu | B23K 20/004 228/4.5 |
| 2007/0257083 | A1 * | 11/2007 | Narasimalu | B06B 3/00 228/1.1 |
| 2008/0121679 | A1 * | 5/2008 | Li | B06B 3/00 228/1.1 |
| 2008/0302857 | A1 * | 12/2008 | Felber | B23K 20/004 228/47.1 |
| 2011/0056267 | A1 * | 3/2011 | Qin | B06B 1/0223 73/1.82 |
| 2012/0125977 | A1 * | 5/2012 | DeAngelis | B23K 20/007 228/110.1 |
| 2015/0128405 | A1 * | 5/2015 | Zhang | B25J 15/0028 29/559 |
| 2016/0023298 | A1 * | 1/2016 | Song | B23K 20/005 228/1.1 |

* cited by examiner

FIG. 2
(a)
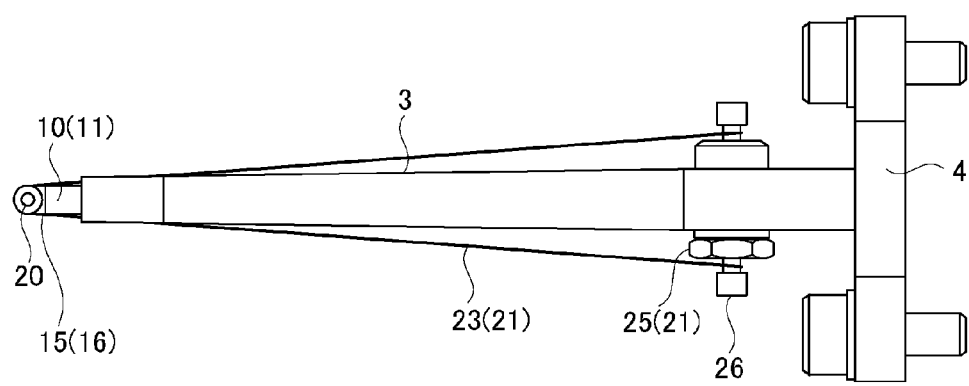
(b)
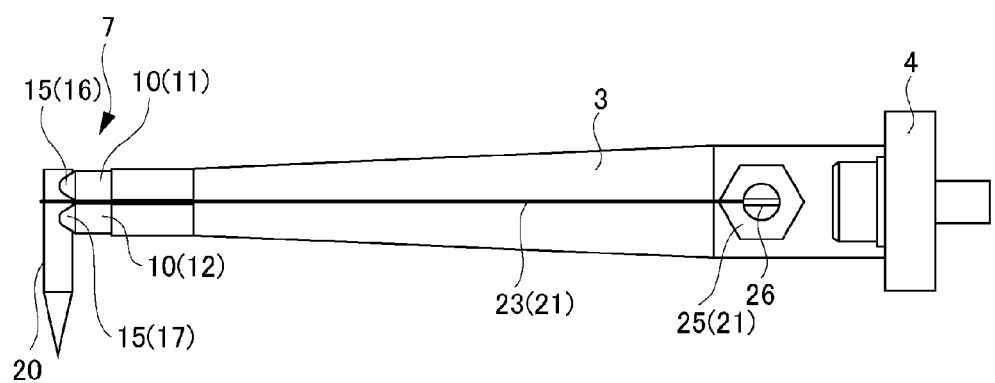

FIG. 7
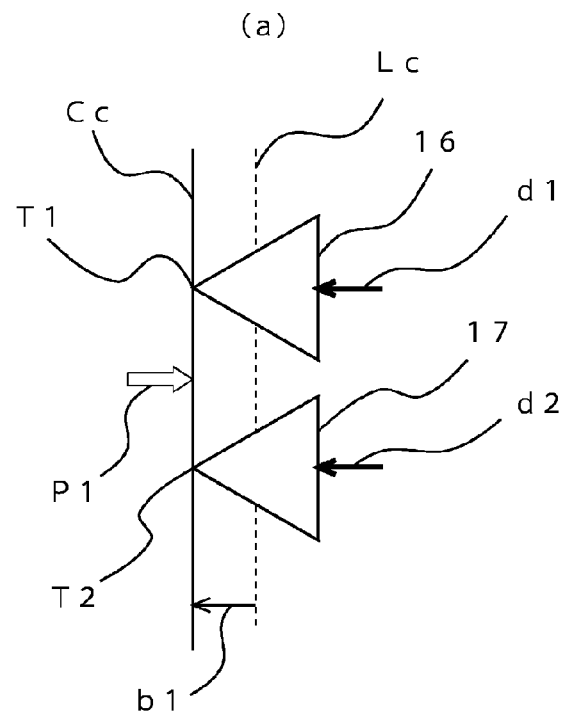
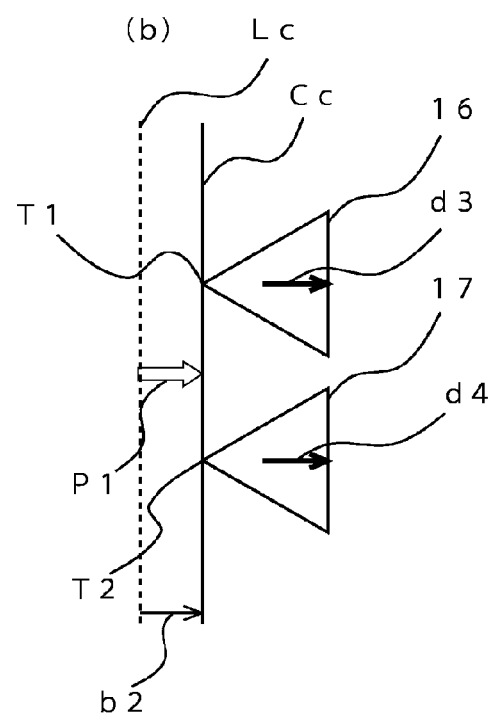

FIG. 9
(a)
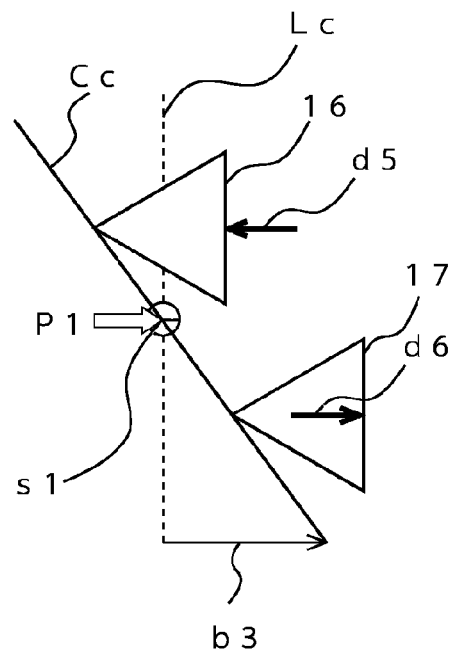
(b)
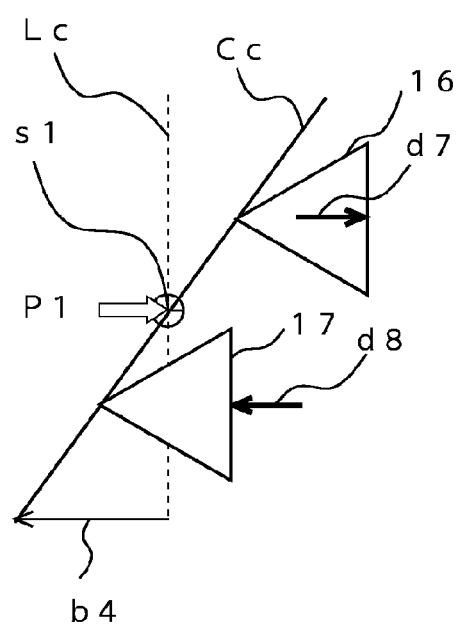

FIG. 11
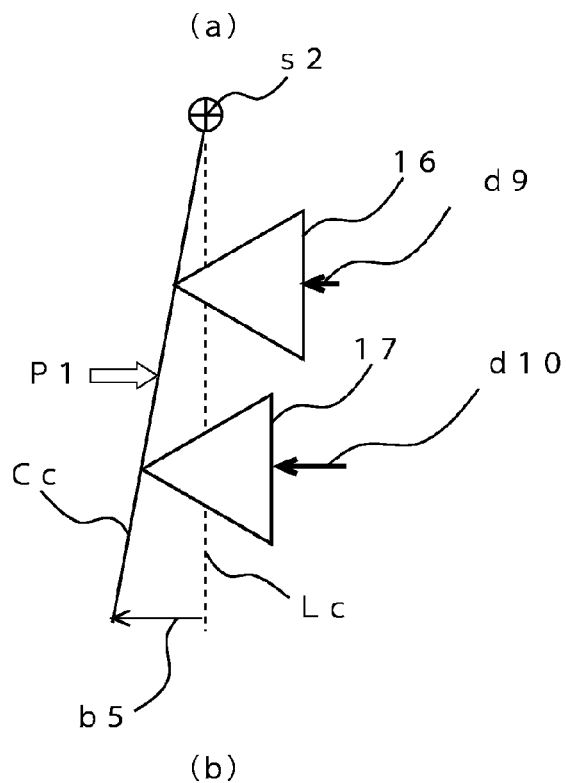
(a)
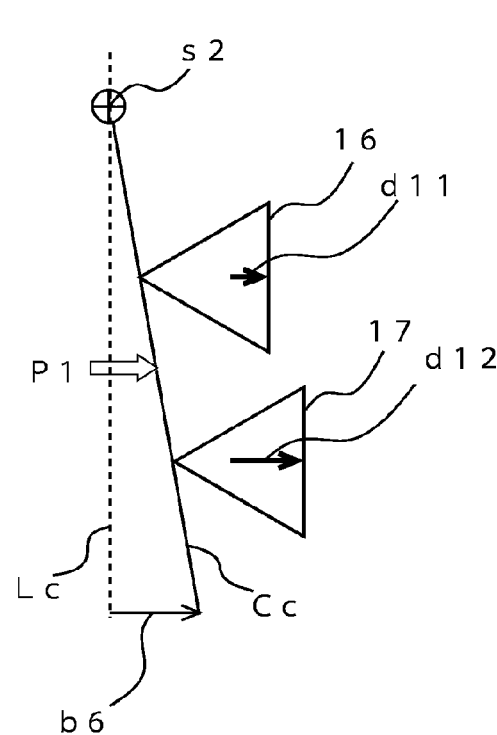
(b)

FIG. 13
(a)
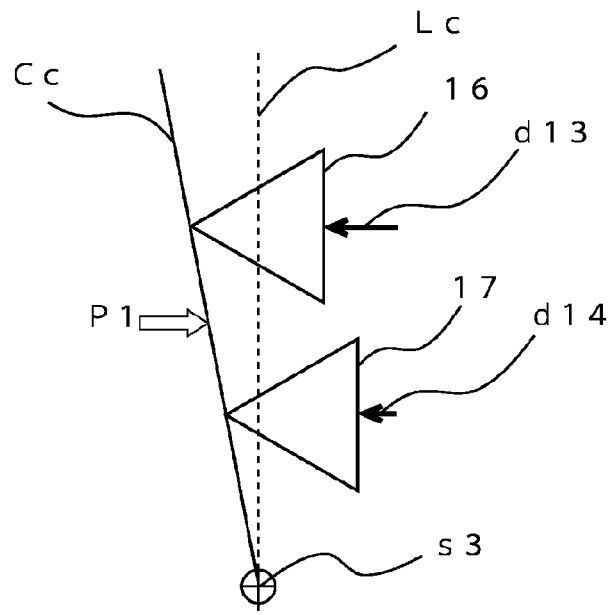
(b)
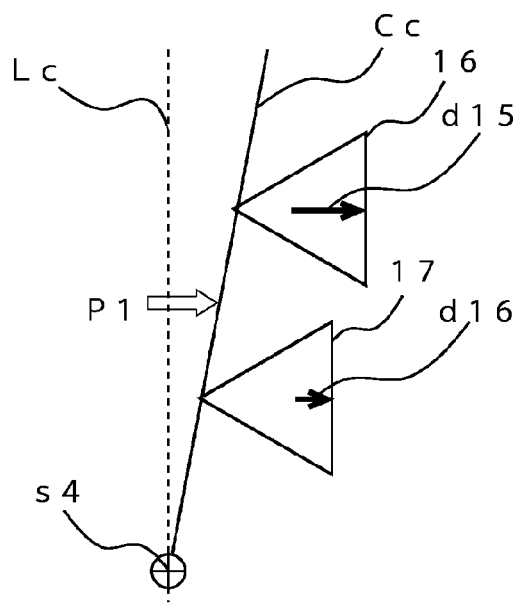

FIG. 15
(a)
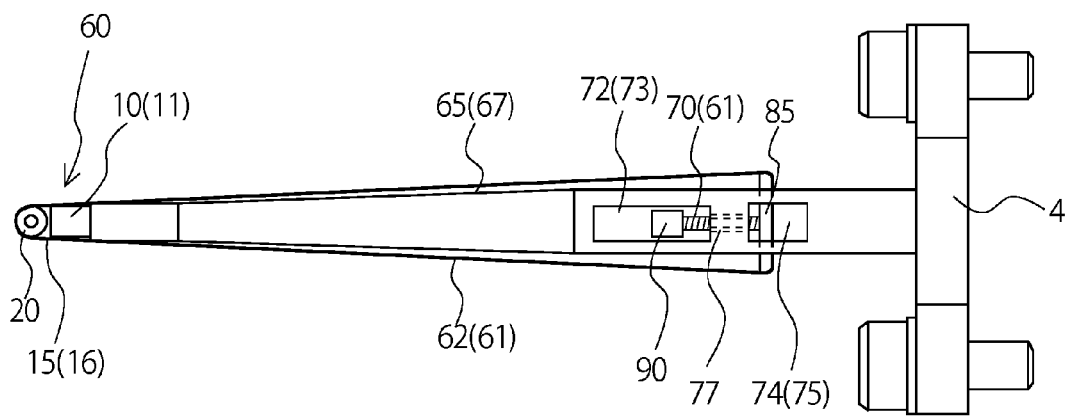
(b)
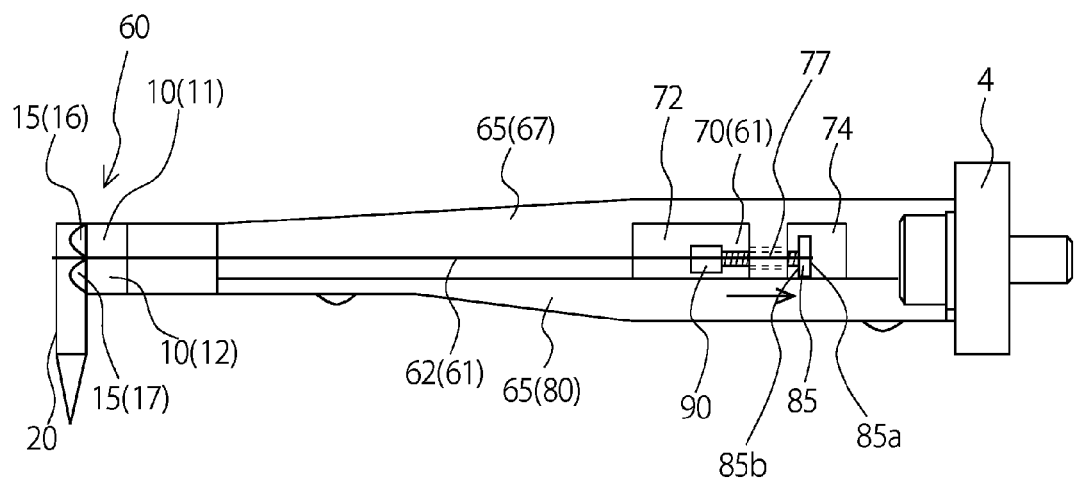

FIG. 19
(a)
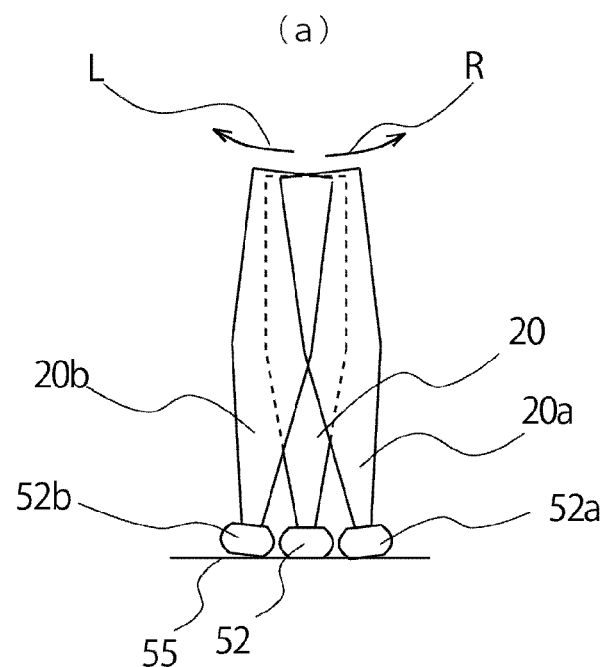
(b)
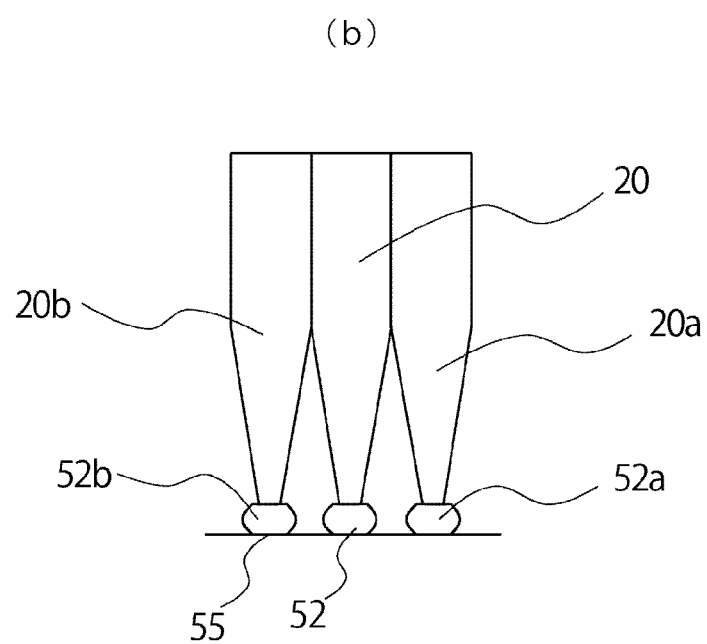

BONDING DEVICE

TECHNICAL FIELD

The present invention relates to a bonding device, and in particular, relates to a bonding device capable of adequately controlling a leading end of a capillary as a bonding tool for bonding a wire.

BACKGROUND ART

Conventionally, there has been known a wire bonding device that bonds an electrode of a semiconductor chip and a lead for wiring formed on a substrate with a wire.

A wire bonding device presses a ball formed at a leading end of a wire to an electrode of a semiconductor chip with ultrasonic vibration to bond the ball thereto and presses the wire to a lead with ultrasonic vibration, so that the electrode on the semiconductor chip and the lead on the substrate are bonded.

In a wire bonding device, a bonding head is fixed as being placed on an XY-table movable in two-dimensional directions. A bonding arm that constitutes the bonding head is configured to be rotatable about a support shaft. The bonding arm is provided at a leading end at one side with an ultrasonic horn to which a capillary serving as a bonding tool is attached and is provided at the other side with an ultrasonic transducer serving as an ultrasonic applying unit that applies ultrasonic vibration to the capillary via the ultrasonic horn.

Here, the ultrasonic horn of the conventional bonding arm is required to have a length on the basis of λ (acoustic wavelength)/2. Further, when the ultrasonic horn is attached to the bonding head serving as the bonding arm, the ultrasonic horn is fixed to a position at a node of λ/4. Thus, there have been restrictions for the length, the support method, and the like.

To eliminate such restrictions, Patent Document 1 discloses a wire bonding device in which a piezoelectric element that transmits vibration to a capillary with an electric strain effect or a magnetic strain effect is assembled to a bonding arm in the vicinity of a position where the capillary is attached.

Further, Patent Document 2 discloses a low mass transducer having a vibration generating mechanism assembled to a capillary.

CITED DOCUMENT

Patent Document

Patent Document 1: Japanese Patent Application Laid-Open No. H5-275502
Patent Document 2: U.S. Pat. No. 5,890,643

SUMMARY OF THE INVENTION

The wire bonding device disclosed in Patent Document 1 has a structure in which the piezoelectric element that transmits vibration to the capillary is assembled to the bonding arm in the vicinity of a position where the capillary is attached. According to the bonding arm in Patent Document 1, the vibration of the piezoelectric element is transmitted to the capillary via a frame-shaped vibration transmitting portion.

Here, the mass of the vibration transmitting portion becomes large as a load to be driven by the piezoelectric element. Further, the piezoelectric element has been required to be upsized for driving a large load.

The piezoelectric element is fixed at a frame-shaped hole formed at the bonding arm and pressure is to be applied to the piezoelectric element via the frame. Accordingly, there has been a problem that vibration amplitude cannot be effectively generated owing to that stiffness of the frame disturbs expansion of the piezoelectric element.

Further, in Patent Document 2, it is required to arrange a dedicated capillary into which the vibration generating mechanism using the piezoelectric element is assembled. Here, the vibration generating mechanism is difficult to be arranged in a capillary that is usually used. Further, since the vibration generating mechanism is assembled in the capillary being consumable, it becomes expensive.

Accordingly, it has been desired to achieve lightening and downsizing of the load of the vibration transmitting portion and the like for driving the piezoelectric element of the bonding arm and to transmit stable vibration to the capillary. Here, a variety of components are to be bonded. It has been desired that a leading end of the capillary is adequately controlled when a ball formed at a leading end of a wire is pressed and bonded to an electrode of a semiconductor chip with scrub vibration.

Further, in the bonding device, there may be a case that the capillary is inclined while the motion thereof is disturbed by a load at a contact face with scrub action of the capillary vibrating in the longitudinal direction of a bonding arm for bonding. When the capillary is inclined, there is a fear that bonding malfunction occurs at a bonding face, for example, between the ball and the electrode of the semiconductor chip In view of the above, an object of the present invention is to provide a bonding device capable of adequately controlling a leading end of a capillary while, for being used for a variety of bonding components, two piezoelectric elements are arranged along the axial direction of the capillary via capillary holding portions and the two piezoelectric elements expand and contract respectively in a direction perpendicular r to the axial direction of the capillary as being vibrated separately.

Further, an object of the present invention is to provide a bonding device capable of vibrating the capillary while correcting inclination of the capillary by performing functional operation of amplitude, phase, frequency, and/or waveform on voltage waveforms to be applied to the respective piezoelectric elements.

To achieve the abovementioned object, a bonding device of the present invention is a bonding device that includes a vibration driving portion to vibrate a capillary, the vibration driving portion including a plurality of piezoelectric elements that are expanded and contracted along an axial direction of a bonding arm respectively with one end thereof fixed to a leading end of the bonding arm, a plurality of capillary holding portions that are in contact respectively with a circumferential face of the capillary at a base end side thereof as being fixed correspondingly to the other end of the piezoelectric elements, and a pressing-holding portion that sandwiches the capillary as pressing the capillary to the capillary holding portions with at least one end side fixed to the bonding arm and the other end side being in contact with the circumferential face of the capillary at the base end side thereof on a side opposite to the capillary holding portions.

Further, in the bonding device of the present invention, the vibration driving portion operates without utilizing resonance.

Further, in the bonding device of the present invention, the piezoelectric elements are arranged along the axial direction of the capillary.

Further, in the bonding device of the present invention, the piezoelectric elements are two piezoelectric elements that are arranged along the axial direction of the capillary, the two piezoelectric elements being a first piezoelectric element and a second piezoelectric element arranged below the first piezoelectric element.

Further, in the bonding device of the present invention, voltage waveforms having the same phase are applied to the first piezoelectric element and the second piezoelectric element.

Further, in the bonding device of the present invention, voltage waveforms with a phase difference of 180 degrees set therebetween at the same frequency are applied to the first piezoelectric element and the second piezoelectric element.

Further, in the bonding device of the present invention, amplitude of voltages to be applied to the first piezoelectric element and the second piezoelectric element can be varied.

Further, in the bonding device of the present invention, voltage waveforms to be applied to the first piezoelectric element and the second piezoelectric element have the same phase and an amplitude ratio of the voltage waveforms for the first piezoelectric element and the second piezoelectric element is different.

Further, in the bonding device of the present invention, the piezoelectric elements are capable of causing the capillary to perform operation required for bonding owing to that functional operation of amplitude, phase, frequency, or waveform is performed on drive voltage waveforms to be applied to the respective piezoelectric elements.

Further, in the bonding device of the present invention, the capillary is vibrated while inclination of the capillary caused by a leading end of the capillary being pulled with a load at a contact face of the capillary is corrected by performing functional operation of amplitude, phase, frequency, or waveform on a drive voltage waveform to each of the piezoelectric elements.

Further, in the bonding device of the present invention, the pressing-holding portion is a string-like member, a tape-shaped member, or a frame member.

Further, the bonding device of the present invention is a wire bonding device.

A bonding device of the present invention is a bonding device that includes a plurality of piezoelectric elements to vibrate a capillary. Here, the capillary is vibrated while inclination of the capillary caused by a leading end of the capillary being pulled with a load at a contact face of the capillary is corrected by performing functional operation of amplitude, phase, frequency, or waveform on a drive voltage waveform to each of the piezoelectric elements.

According to the present invention, the bonding device can adequately control the leading end of the capillary while a plurality, especially two, of piezoelectric elements are arranged along the axial direction of the capillary via the capillary holding portions and the two piezoelectric elements expand and contract respectively in a direction perpendicular to the axial direction of the capillary as being vibrated separately. Accordingly, the bonding device can be used for a variety of bonding components.

Further, according to the present invention, the bonding device can vibrate the capillary while inclination of the capillary is corrected during bonding by performing a variety of functional operation of amplitude, phase, frequency, or waveform for the voltage waveform to be applied to each of the piezoelectric elements. Accordingly, it is possible to prevent bonding malfunction from occurring at a bonding face between a ball and an electrode of a semiconductor chip.

Further, according to the bonding device of the present invention, since the pressing-holding portion that sandwiches the capillary as pressing the capillary to the capillary holding portion is shaped as a string-like member, a tape-shaped member, or a frame member and is formed of a material having small mass and volume, the load to be driven by the piezoelectric element can be lightened. Accordingly, the capillary can be directly driven with improved responsibility.

Further, according to the bonding device of the present invention, it is possible to vary, during bonding, amplitude, phase, or frequency of the voltage waveform to be applied to each of the capillaries. For example, it is possible that an oxide film on a surface is eliminated with scrub action at first, and a ball or a wire is bonded with an appropriate vibration behavior of the capillary thereafter.

BRIEF DESCRIPTION OF THE DRAWINGS

FIG. 2 illustrates a structure of the vibration driving portion to vibrate the capillary as being attached to the leading end of the bonding arm of the bonding device; while FIG. 2(a) is a plane view and FIG. 2(b) is a side view.

FIG. 7 provides model diagrams describing a first vibration behavior of the capillary; while FIG. 7(a) is a model diagram of the vibration behavior when the maximum positive voltage having the same phase is applied to an upper piezoelectric element and a lower piezoelectric element, and FIG. 7(b) is a model diagram of the vibration behavior when the maximum negative voltage having the same phase is applied to the upper piezoelectric element and the lower piezoelectric element.

FIG. 9 provides model diagrams describing a second vibration behavior of the capillary; while FIG. 9(a) is a model diagram of the vibration behavior when the maximum positive voltage is applied to the upper piezoelectric element and the maximum negative voltage is applied to the lower piezoelectric element, and FIG. 9(b) is a model diagram when the maximum negative voltage is applied to the upper piezoelectric element and the maximum positive voltage is applied to the lower piezoelectric element.

FIG. 11 provides model diagrams describing a third vibration behavior of the capillary; while FIG. 11(a) is a model diagram of the vibration behavior when positive voltages with the amplitude ratio thereof being one to two having the same phase are applied to the upper piezoelectric element and the lower piezoelectric element, and FIG. 11(b) is a model diagram of the vibration behavior when negative voltages with the amplitude ratio thereof being one to two having the same phase are applied to the upper piezoelectric element and the lower piezoelectric element.

FIG. 13 provides model diagrams describing a fourth vibration behavior of the capillary; while FIG. 13(a) is a model diagram of the vibration behavior when positive voltages with the amplitude ratio thereof being two to one having the same phase are applied to the upper piezoelectric element and the lower piezoelectric element, and FIG. 13(b) is a model diagram of the vibration behavior when negative voltages with the amplitude ratio thereof being two to one having the same phase are applied to the upper piezoelectric element and the lower piezoelectric element.

FIG. 15 illustrates a structure of a vibration driving portion using a string-like member formed in a loop shape; while FIG. 15(a) is a plane view and FIG. 15(b) is a side view.

FIG. 17 illustrates inclination of the capillary in accordance with movement of the capillary; while FIG. 17(a) illustrates a state of the capillary when the capillary is moved with no load in directions indicated by arrows R, L and FIG. 17(b) illustrates inclination of the capillary during bonding when the capillary is moved with no load in the directions indicated by arrows R, L.

FIG. 19(a) is a view illustrating a state that the posture of the capillary is corrected so that the capillary is inclined in a direction opposite to the capillary illustrated in FIG. 17(b) while arrows R, L indicate directions in which the capillary is moved and FIG. 19(b) is a view illustrating a state that the posture of the capillary is corrected so that the capillary is inclined in a direction opposite to the capillary illustrated in FIG. 17(b).

EMBODIMENTS OF THE INVENTION

In the following, embodiments of a bonding device of the present invention will be described with reference to the drawings. The boding device of the present invention includes, as a vibration driving portion, two piezoelectric elements that are expanded and contracted along an axial direction of a bonding arm respectively with one end thereof fixed to a leading end of the bonding arm, two capillary holding portions that are in contact respectively with a circumferential face of the capillary at a base end side thereof as being fixed correspondingly to the other end of the piezoelectric elements, and a pressing-holding portion that sandwiches the capillary as pressing the capillary to the capillary holding portions with at least one end side fixed to the bonding arm and the other end side being in contact with the circumferential face of the capillary at the base end side thereof on a side opposite to the capillary holding portions. Owing to that the two piezoelectric elements expand and contract respectively in a direction perpendicular to the axial direction of the capillary as being vibrated separately, the bonding device can adequately control the leading end of the capillary.

In the following, as a bonding device using a vibration driving portion, description will be provided on a wire bonding device that bonds an electrode (pad) of a semiconductor chip and a lead for wiring formed on a substrate with a wire.

[First Embodiment of Bonding Device]

First, a first embodiment of a bonding device according to the present invention will be described with reference to FIGS. 1 to 14.

[Structure of Vibration Driving Portion]

Figure 1:
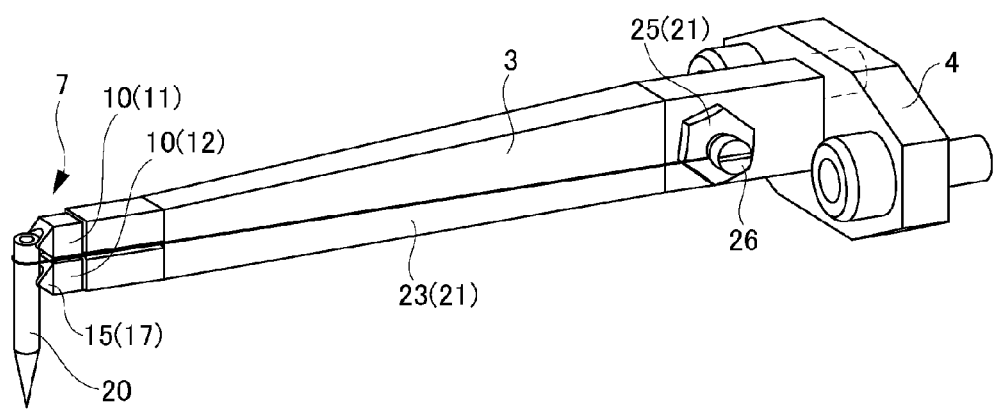
FIG. 1 is a perspective view illustrating a structure of a vibration driving portion to vibrate a capillary as being attached to a leading end of a bonding arm of a bonding device.
Figure 3:
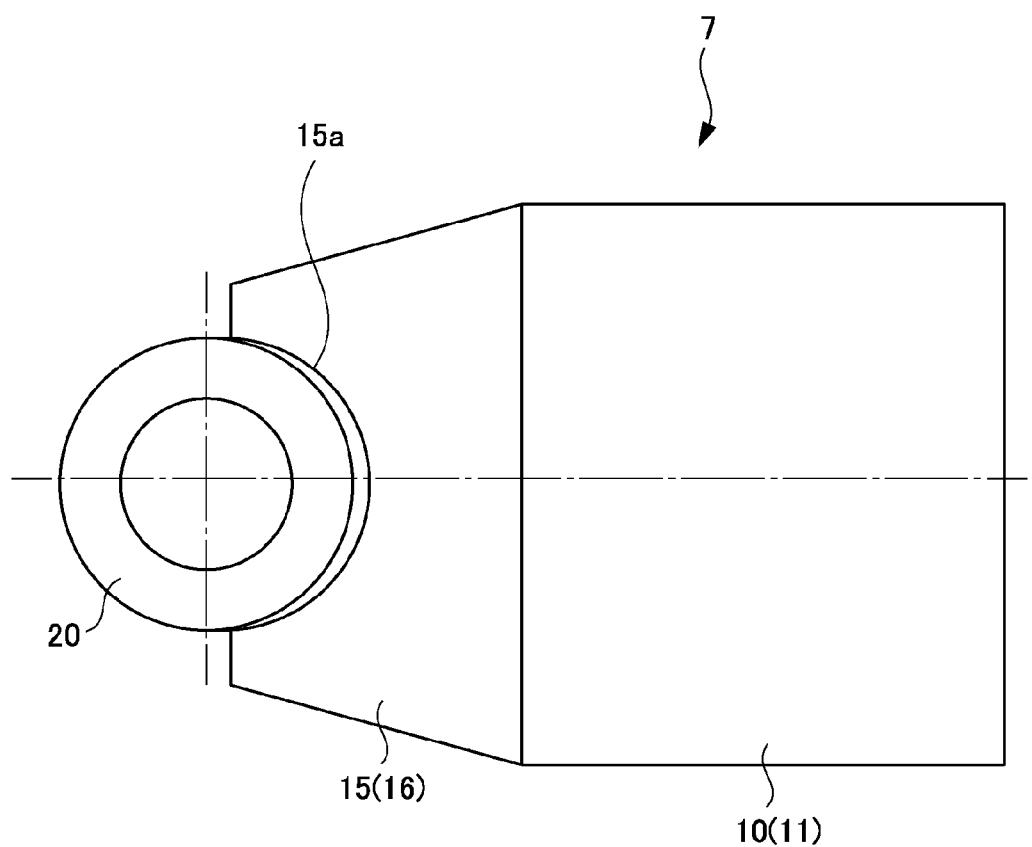
FIG. 3 is a plane view enlarging a capillary attaching section of a capillary holding portion of the vibration driving portion.

FIG. 1 is a perspective view illustrating a structure of a vibration driving portion to vibrate a capillary as being attached to a leading end of a bonding arm of the bonding device. FIG. 2(a) is a plane view illustrating a structure of the vibration driving portion and FIG. 2(b) is a side view illustrating a structure of the vibration driving portion. FIG. 3 is a plane view enlarging a capillary attaching section of a capillary holding portion of the vibration driving portion.

As illustrated in FIGS. 1, 2(a), and 2(b), a vibration driving portion 7 that vibrates a capillary 20 is attached to a leading end of a bonding arm 3. The vibration driving portion 7 includes a piezoelectric element 10, a capillary holding portion 15, and a string-like member 23 that fixes the capillary 20 to the capillary holding portion 15 and applies preliminary pressure to the piezoelectric element 10.

The piezoelectric element 10 is formed by layering and integrating thin piezoelectric elements formed of ceramics or the like. Deformation is generated by applying voltage to electrode terminals thereof. For example, when high-frequency voltage is applied to the electrode terminals of the piezoelectric element 10, vibration is generated as repeating to cause deformation in accordance with a frequency, amplitude, and the like of the high-frequency voltage.

As illustrated in FIGS. 1 and 2(b), in the vibration driving portion 7, two piezoelectric elements 10 arranged one above the other are attached to the leading end of the bonding arm 3. Here, in the side view of FIG. 2(b), the piezoelectric element 10 at the upper side is illustrated as an upper piezoelectric element 11 and the piezoelectric element 10 at the lower side is illustrated as a lower piezoelectric element 12. Here, the upper piezoelectric element 11 corresponds to the first piezoelectric element in the claims and the lower piezoelectric element 12 corresponds to the second piezoelectric element in the claims. The second piezoelectric element is arranged below the first piezoelectric element.

The piezoelectric element 10 is fixed to the bonding arm 3 with an adhesive or the like at a face in contact with the bonding arm 3. The upper piezoelectric element 11 and the lower piezoelectric element 12 are capable of operating independently from each other. Each of the piezoelectric elements 10 expands and contracts along the axial direction of the bonding arm 3.

The capillary holding portion 15 is located between the piezoelectric element 10 and the capillary 20 to hold the capillary 20 and to effectively transmit vibration of the piezoelectric element 10. The capillary holding portion 15 is formed as being reduced in size and weight. Here, in the side view of FIG. 2(b), the capillary holding portion 15 at the upper side is illustrated as an upper capillary holding portion 16 and the capillary holding portion 15 at the lower side is illustrated as a lower capillary holding portion 17.

The capillary holding portion 15 is fixed to the piezoelectric element 10 with an adhesive or the like at a face in contact with the piezoelectric element 10. The upper capillary holding portion 16 is fixed to the upper piezoelectric element 11 and the lower capillary holding portion 17 is fixed to the lower piezoelectric element 12.

One end of the capillary holding portion 15 is fixed to the piezoelectric element 10 and a concave portion (curved face) 15a for holding the capillary 20 is formed at the other end of the capillary holding portion 15. The capillary 20 is attached to the capillary holding portion 15 with the circumferential face at the base end side being in contact therewith.

FIG. 3 is a plane view enlarging the capillary attaching section of the capillary holding portion of the vibration driving portion. As illustrated in FIG. 3, the capillary 20 is held by the capillary holding portion 15 while both edges of the curved face 15a in the vicinity of the leading end thereof are contacted to two positions of an outer circumferential surface of the capillary 20 linearly along the axial direction of the capillary 20. Accordingly, a gap is generated between the curved face 115a of the capillary holding portion 15 and the surface of the capillary 20.

Thus, the two piezoelectric elements being the upper piezoelectric element 11 and the lower piezoelectric element 12 are arranged one above the other along the axial direction of the capillary 20 via the upper capillary holding portion 16 and the lower capillary holding portion 17 respectively. The upper piezoelectric element 11 and the lower piezoelectric element 12 expand and contract respectively in a direction perpendicular to the axial direction of the capillary 20 as being fixed to the bonding arm 3 respectively at the face on the opposite side to the capillary 20.

As illustrated in FIG. 1, the string-like member 23 is stretched by a tension mechanism 25 along an outer circumference at a face of the capillary 20 opposite to the capillary holding portion side. Thus, the string-like member 23 is wound to a half circumferential face of the capillary 20 at the base end side on the side opposite to the capillary holding portion. Here, a pressing-holding portion 21 that presses and holds the capillary 20 to the plurality of capillary holding portions 15 is structured with the string-like member 23 and the tension mechanism 25.

The string-like member 23 that fixes the capillary 20 to the capillary holding portion 15 may be made of a metal, high-strength fiber, or composite material thereof having sufficient tensile strength and flexibility to have mass and volume extremely reduced with a small wire diameter.

The string-like member 23 generates tensile force by being pulled by the tension mechanism 25 and holds the capillary 20. Here, in the side view of FIG. 2(b), the string-like member 23 is stretched along the periphery of the bonding arm 3 to be perpendicular to the axial direction of the capillary 20 as passing between the upper capillary holding portion 16 and the lower capillary holding portion 17 and between the upper piezoelectric element 11 and the lower piezoelectric element 12.

Here, a member having a tape-like shape with a predetermined width (tape-shaped member) may be adopted as the string-like member 23 to press and hold the capillary 20. The tape-shaped member is made of a material having tensile strength, flexibility, and small mass and volume.

As illustrated in FIG. 2(a), the tension mechanism 25 has a function to arbitrarily adjust and maintain tensile force against the string-like member 23 as pulling both ends of the string-like member 23. The tension mechanism 25 includes rod-shaped members 26 provided to both sides at a bonding arm attaching portion 4 side. End sections of the string-like member 23 are wound up by the rod-shaped member 26, so that tensile force is applied to the string-like member 23. Here, the rod-shaped member 26 is rotated with a torque driver at predetermined torque to adjust a preliminary pressure to the capillary 20.

The capillary 20 is pressed by the, string-like member 23 to the bonding arm 3 toward the piezoelectric element 10 side and is held by the capillary holding portion 15. Further, owing to that tensile force is generated by the tension mechanism 25 at the string-like member 23 to press the capillary 20, required preliminary pressure is applied to the piezoelectric element 10 attached to the leading end of the bonding arm 3 via the capillary holding portion 15.

According to the tension mechanism 25 illustrated in FIG. 2(a), tensile force is applied to the string-like member 23 by winding the end sections of the string-like member 23 with the rod-shaped member 26. However, it is also possible to apply tensile force to the string-like member 23 by pulling one end of the string-like member 23 with the other end of the string-like member 23 fixed.

Thus, action due to expansion and contraction of the piezoelectric elements 10 is provided to the capillary 20 via the upper capillary holding portion 16 and the lower capillary holding portion 17.

Regarding ultrasonic vibration in the related art, a piezoelectric element vibrates a horn being a load to transmit vibration amplitude to a capillary. Here, it is required to vibrate the capillary on the horn at the maximum amplitude by utilizing resonance of the horn. In the present invention, vibration is transmitted from the piezoelectric element 10 directly to the capillary 20 not via a horn. Accordingly, bonding can be performed with ultrasonic vibration generated freely in a range of the characteristic frequency of the piezoelectric element 10 without utilizing resonance of the piezoelectric element 10.

Thus, regarding ultrasonic vibration in the related art, since the capillary is required to be vibrated at the maximum amplitude on the horn, there is a limitation for the length of the horn and the attaching position of the capillary to be integral multiple of a half wavelength of the ultrasonic vibration. In the present invention, since vibration based on resonance of the horn is not utilized, it is not subject to the abovementioned limitation.

Since the capillary holding portion 15 is downsized and lightened, direct driving to directly drive the capillary 20 by the piezoelectric element 10 becomes possible and capillary 20 can be effectively vibrated.

Further, since a metal, high-strength fiber, or composite material thereof having tensile strength and flexibility is used for the string-like member 23, the wire diameter of the string-like member 23 can be lessened and mass and volume thereof can be extremely lessened.

Further, since preliminary pressure is applied by the string-like member 23 having extremely small mass and volume, the load to be driven by the piezoelectric element 10 can be lightened and downsized, so that stable vibration can be transmitted to the capillary 20 without disturbing operation of expansion and contraction of the piezoelectric element 10.

[Drive Circuit for Piezoelectric Element]

Figure 4:
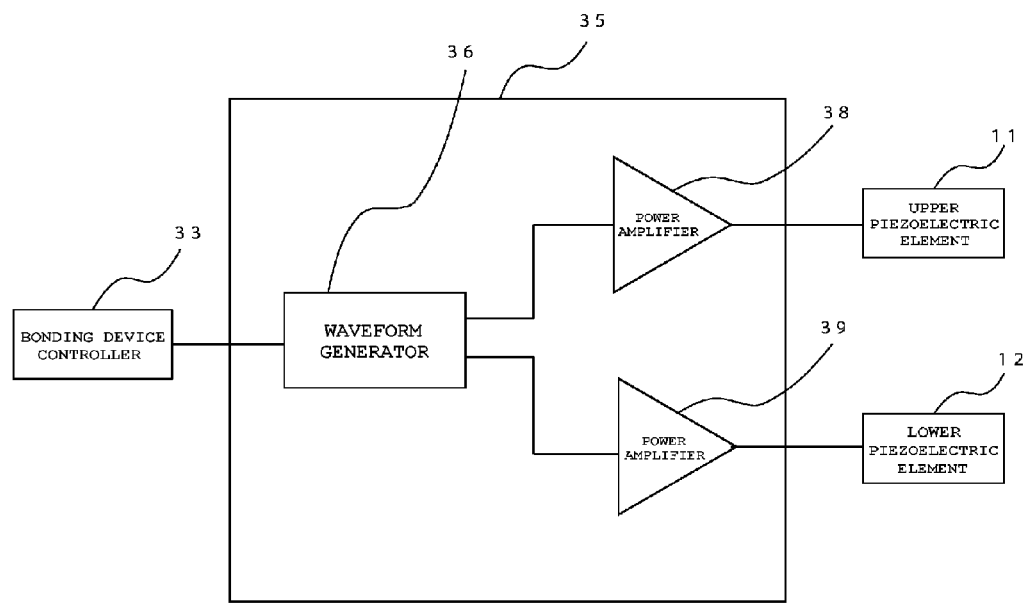
FIG. 4 is a block diagram illustrating a configuration of an ultrasonic generator that drives a piezoelectric element.

Next, an ultrasonic generator that drives the piezoelectric element assembled in the vibration driving portion will be described with reference to FIG. 4. FIG. 4 is a block diagram illustrating a configuration of the ultrasonic generator that drives the piezoelectric element.

As illustrated in FIG. 4, an ultrasonic generator 35 that drives the upper piezoelectric element 11 and the lower piezoelectric element 12 includes a waveform generator 36 and power amplifiers 38, 39. The waveform generator 36 outputs a sine wave signal having a predetermined frequency to the power amplifiers 38, 39 based on instructions from a controller 33 of the bonding device 1.

The controller 33 of the bonding device 1 outputs, to the waveform generator 36, various data being a frequency and amplitude of a sine wave for generating a voltage waveform to drive the upper piezoelectric element 11 and the lower piezoelectric element 12, a phase difference between the voltage waveforms of the upper piezoelectric element 11 and the lower piezoelectric element 12, and a voltage bias value.

The waveform generator 36 sets drive conditions, based on the data from the controller 33 of the bonding device 1, such as amplitude and a frequency of a sine wave of a built-in oscillator (not illustrated), a phase difference of the voltage waveforms, the voltage bras value, and the like. In accordance with an instruction from the controller 33 of the bonding device 1, the waveform generator 36 outputs signals to the power amplifiers 38, 39.

Here, the signals, output from the waveform generator 36 to the power amplifiers 38, 39 are generated based on the amplitude of the voltage waveform being the sine wave for each of the upper piezoelectric element 11 and the lower piezoelectric element 12, the frequency of the voltage waveform, the phase difference between the voltage waveforms of the upper piezoelectric element 11 and the lower piezoelectric element 12, and the bias value of the voltage waveform, that are set at the waveform generator 36.

The power amplifiers 38, 39 power-amplify signals from the waveform generator 36. The power amplifier 38 outputs to the upper piezoelectric element 11 and the power amplifier 39 outputs to the lower piezoelectric element 12. Here, the power amplifiers 38, 39 have voltage and ampacity necessary for driving the piezoelectric elements 10 at constant voltage based on instruction voltage from the waveform generator 36.

Thus, according to the instruction output from the controller 33 of the bonding device 1 to the waveform generator 36, the amplitude and frequency of the sine wave, the phase difference of the voltage waveforms, and the like are controlled. Here, since the ultrasonic generator 35 can output only positive voltage by setting the voltage bias value, it is possible to adopt a single voltage type piezoelectric element.

Each of the piezoelectric elements 10 being the upper piezoelectric element 11 and the lower piezoelectric element 12 is to be used in a frequency range below its resonance frequency. Accordingly, the capillary 20 can be stably vibrated in a wide frequency range from a low frequency to a high frequency.

[Drive Waveform of Piezoelectric Element and First Vibration Behavior of Capillary]

Next, a vibration behavior of the capillary of the vibration driving portion will be described. At first, a first vibration behavior of the capillary when the voltage waveforms having the same phase are applied to the upper piezoelectric element and the lower piezoelectric element will be described.

Figure 5:
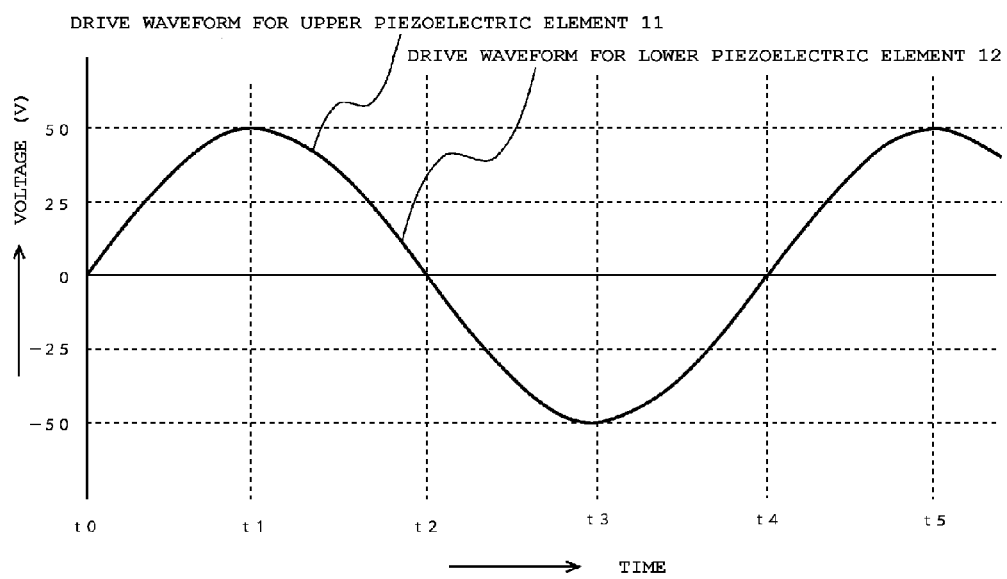
FIG. 5 illustrates an example of waveforms of voltage applied from power amplifiers to piezoelectric elements.

FIG. 5 illustrates an example of waveforms of voltage applied from the power amplifiers to the piezoelectric elements. As illustrated in FIG. 5, the waveforms of the voltage applied from the power amplifiers 38, 39 to the piezoelectric elements are sine wave voltage waveforms having the same phase. In FIG. 5, the drive waveform for the upper piezoelectric element 11 and the drive waveform for the lower piezoelectric element 12 are the same and are indicated by a solid line.

In an example illustrated in FIG. 5, the amplitude is 50 V, the bias voltage is 0 V, the maximum positive voltage is 50 V, and the maximum negative voltage is −50 V. A period from t0 to t4 in FIG. 5 denotes one cycle and the frequency thereof is $1/(t4-t1)$.

Further, it is also possible to drive the piezoelectric element only with positive voltage. For example, when the piezoelectric element is a single voltage type piezoelectric element, positive bias voltage is applied so that the drive voltage does riot become negative voltage.

Figure 6:
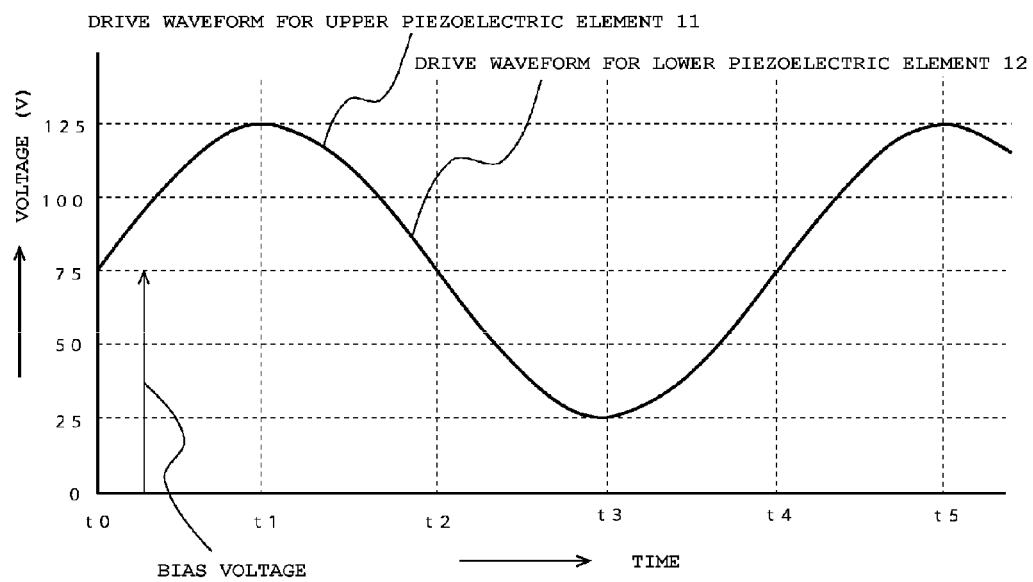
FIG. 6 illustrates an example of waveforms of voltage applied from the power amplifiers to the piezoelectric elements to which positive bias voltage is applied.

FIG. 6 illustrates an example of waveforms of voltage applied from the power amplifiers to the piezoelectric elements to which positive bias voltage is applied. As illustrated in FIG. 6, the bias voltage of 75 V is applied at t0 respectively to the upper piezoelectric element 11 and the lower piezoelectric element 12. The state of the maximum voltage 125 V being applied to the upper piezoelectric element 11 and the lower piezoelectric element 12 is obtained at t1. After returning at t2, that is, at a half cycle, to the state of the bias voltage 75 V being applied, the minimum voltage 25 V is applied to the upper piezoelectric element 11 and the lower piezoelectric element 12 at t3. Then, the state of the bias voltage of 75 V being applied respectively is obtained at t4.

Next, the first vibration behavior of the capillary when the voltage waveforms having the same phase are applied to the upper piezoelectric element and the lower piezoelectric element will be described with reference to FIG. 7.

FIGS. 7(a) and 7(b) are model diagrams describing the first vibration behavior of the capillary. FIGS. 7(a) and 7(b) illustrate an example of a displacement state of the capillary in accordance with the preliminary pressure caused by the string-like member against the center axis of the capillary and movement of the upper capillary holding portion and the lower capillary holding portion caused by the deformation of the piezoelectric elements.

FIG. 7(a) is a model diagram of the vibration behavior when the maximum positive voltage having the same phase is applied to the upper piezoelectric element and the lower piezoelectric element. FIG. 7(b) is a mode diagram of the vibration behavior when the maximum negative voltage having the same phase is applied to the upper piezoelectric element and the lower piezoelectric element.

In FIGS. 7(a) and 7(b), a broken line to indicates the origin position of the center axis of the capillary 20 when no voltage is applied to the upper piezoelectric element 11 and the lower piezoelectric element 12, that is, when deformation amounts of the upper piezoelectric element 11 and the lower piezoelectric element 12 are zero (0) and a thick straight line Cc indicates the center axis. Further, an arrow P1 indicates the preliminary pressure caused by the string-like member 23 applied to the center axis of the capillary 20. The upper capillary holding portion 16 is model ed as a triangle (indicated with a reference 16) located at the upper side as contacting to the center axis Cc of the capillary 20. The lower capillary holding portion 17 is modeled as a triangle (indicated with a reference 17) located at the lower side as contacting to the center axis Cc.

An intersection point T1 of the upper capillary holding portion 16 contacting to the center axis Cc of the capillary indicates a center point where the upper capillary holding portion 16 acts on the capillary 20 or a center point where the capillary 20 acts on the upper capillary holding portion 16. Similarly, an intersection point 12 of the lower capillary holding portion 17 contacting to the center axis Cc of the capillary indicates a center point where the lower capillary holding portion 17 acts on the capillary 20 or a center point where the capillary 20 acts on the lower capillary holding portion 17.

Further, b1 in FIG. 7(a) indicates a movement amount of the capillary 20 at the leading end thereof when the maximum positive voltage having the same phase is applied to the upper piezoelectric element and the lower piezoelectric element, and b2 in FIG. 7(b) indicates a movement amount of the capillary 20 at the leading end thereof when the maximum negative voltage having the same phase is applied to the upper piezoelectric element and the lower piezoelectric element.

An arrow d1 at the right side of the center axis of the capillary 20 indicates a movement amount and a movement direction of the upper capillary holding portion 16 from the reference position (the position where the deformation amount of the upper piezoelectric element 11 is zero (0)) due to the deformation of the upper piezoelectric element 11. An arrow d2 indicates a movement amount and a movement, direction of the lower capillary holding portion 17 from the reference position (the position where the deformation amount of the lower piezoelectric element 12 is zero (0)) due to the deformation of the lower piezoelectric element 12.

Further, an arrow d3 illustrated in FIG. 7(b) indicates a movement amount and movement direction of the upper capillary holding portion 16 from the reference position due to the deformation of the upper piezoelectric element 11 and an arrow d4 indicates a movement amount and a movement direction of the lower capillary holding portion 17 from the reference position due to the deformation of the lower piezoelectric element 12.

That is, each of the arrows d1, d2, d3, and d4 indicates a deformation amount of the upper piezoelectric element 11 or the lower piezoelectric element 12 by the arrow length and indicates a deformation direction by the arrow direction when voltage is applied to the upper piezoelectric element 11 and the lower piezoelectric element 12. Here, the deformation amount of each piezoelectric element depends on magnitude of amplitude of a voltage waveform applied to the piezoelectric element and the deformation direction of each piezoelectric element is determined by the polarity of the voltage waveform applied to the piezoelectric element.

The string-like member 23 is pulled by the tension mechanism 25 in a state that voltage is not applied to the piezoelectric elements 10 being the upper piezoelectric element 11 and the lower piezoelectric element 12. Accordingly, the capillary 20 is pressed to the capillary holding portion 15 being the upper capillary holding portion 16 and the lower capillary holding portion 17 with predetermined tensile force, so that the preliminary pressure is applied to the piezoelectric elements 10 via the capillary holding portion 15. Here, the string-like member 23 is extended by being pulled by the tension mechanism 25 with a predetermined load. An extension amount of the string-like member 23 is determined by sectional area, Young modulus (longitudinal elastic modulus), and a length of the string-like member 23.

Owing to that positive voltage is applied to the piezoelectric elements 10 being the upper piezoelectric element 11 and the lower piezoelectric element 12, the piezoelectric elements 10 are deformed as being expanded and the capillary is moved to extend the string-like member 23. Accordingly, the string-like member 23 receives a load as external force and is extended.

[Force Necessary for Vibrating Piezoelectric Element at Predetermined Amplitude]

Description will be provided on force necessary for vibrating the piezoelectric element at predetermined amplitude in a state that the preliminary pressure is applied to the string-like member.

For example, the preliminary pressure (tensile force) of the string-like member is denoted by P (N) and young modulus of the string-like member is denoted by E (GPa). E (GPa) is expressed as E (GPa)=1000E(N/mm$^2$).

The preliminary pressure (tensile force) P is expressed by Expression (1)

$$P = 1000 E \times \epsilon \times A \quad (1)$$

$\epsilon$: Strain of the string-like member

A (mm$^2$): Sectional area of the string-like member

When the string-like member is cylindrical having a radius r (mm) P is expressed as 1000E×ϵ×π×r2 while 2 denotes square.

When the string-like member is made of the material being Zylon (registered trademark), Young modulus E is expressed as E=270(Gpa)=270000(N/mm$^2$)

When the radius r of the string-like member is 0.1 (mm) and π is 3.14, the preliminary pressure P is expressed by Expression (2).

$$P = 270000 \times \epsilon \times 3.14 \times 0.1**2 = 8478 \times \epsilon \quad (2)$$

When a length of the string-like member at one side is 100 mm, the total length L of the string-like member becomes to 200 mm. Further, the strain ϵ of the string-like member in a state that the preliminary pressure of 100 N is applied to the string-like member is expressed as ϵ=100/8478=0.0118 through Expression (2).

The strain ϵ of the string-like member is expressed as ϵ=ΔL/L. Extension of the string-like member at the preliminary pressure of 100 N, ΔL1 becomes to 2.36 mm through ΔL1=ϵ×L.

Further, when the maximum amplitude of the piezoelectric element is denoted by a and is 3 (μm)=0.003 (mm), a deformation amount of the string-like member due to the piezoelectric element ΔL2 becomes to 0.006 mm through ΔL2=2a=2×0.003.

Accordingly, the total deformation amount ΔL of the string-like member becomes to 2.366 mm through ΔL=ΔL1+ΔL2=2.36+0.006.

At that time, the strain ϵ of the string-like member becomes to 0.01183 through ϵ=ΔL/L=2.366/200.

Further, the preliminary pressure (tensile force) P1 exerted on the string-like member becomes to 100.2947 N through Expression (2) as P1=8478×ϵ=8478×0.01183.

Thus, a force exerted on the string-like member, that is, a force necessary for the piezoelectric element to deform by 3 μm with the preliminary pressure of 100 N, becomes to 100.2947 N. Accordingly, the piezoelectric element to be used herein provides a force exceeding 100.2947 N due to deformation thereof.

Further, since the force exerted on the string-like member is 0.2947 N owing to that the piezoelectric element is deformed by 3 μm with the preliminary pressure 100 N, influence to the preliminary pressure is 0.3% or less. Thus, since expansion and contraction of the piezoelectric element exert little influence on the preliminary pressure, the preliminary pressure due to the string-like member can be kept constant.

Next, strength of the string-like member in a state that the preliminary pressure is exerted on the string-like member will be described. Tensile strength of Zylon (registered trademark) is 5.8 (Gpa) being 5800 (N/mm$^2$) and the maximum tensile force (force to be exerted on the string-like member) f with the radius r=0.1 (mm) becomes to 182 N through f=5800×3.14×0.1**2. The tensile force of the preliminary pressure 50 N at one side of the string-like member is 27% (50/182×100) thereagainst. Thus, the strength of the string-like member has sufficient margin as being three or more times higher than the maximum tensile force.

Thus, the amplitude of the piezoelectric element 10 is several micrometers and the string-like member 23 is extended by several micrometers as well. Here, the length of the string-like member 23 from the tension mechanism 25 to the capillary 20 is about 100 millimeters and the total length thereof is about 200 millimeters. The extension of the string-like member 23 in a state with the preliminary pressure of 100 N is 2.36 mm. In contrast, since a variation of several micrometers is extremely small, a variation of the preliminary pressure to the piezoelectric element 10 is small.

In a state that deformation of the piezoelectric element 10 is zero (0), that is, a voltage is not applied to the piezoelectric element 10, the string-like member 23 returns to have the extension amount at the time of tensile force setting.

Further, owing to that negative voltage is applied to the piezoelectric element 10, the piezoelectric element 10 is deformed as being contracted to reduce the extension amount of the string-like member 23. However, since the amount is extremely small, a variation of the preliminary pressure to the piezoelectric element is small.

Thus, since the strain of the string-like member 23 due to expansion and contraction of the piezoelectric element 10 is extremely small compared to the strain of the string-like member 23 for generating the preliminary pressure, stable preliminary pressure can be maintained.

The ultrasonic generator 35 causes a displacement direction of the capillary 20 to vary for every half cycle of the drive waveform. Owing to that high-frequency voltage is continuously applied to the piezoelectric elements 10 being the upper piezoelectric element 11 and the lower piezoelectric element 12, vibration occurs at the capillary 20.

The vibration frequency of the capillary 20 is determined by the frequency of the high-frequency voltage for driving the piezoelectric elements 10 her the upper piezoelectric element 11 and the lower piezoelectric element 12. The vibration is caused at the piezoelectric elements 10 being the upper piezoelectric element 11 and the lower piezoelectric element 12 with the high-frequency voltage from the ultrasonic generator 35. The vibration is transmitted to the capillary 20 via the upper capillary holding portion 16 and the lower capillary holding portion 17.

When the voltage waveform having the same phase is applied to the upper piezoelectric element and the lower piezoelectric element, the movement amount and movement direction d1 of the upper capillary holding portion 16 and the movement amount and movement direction d2 of the lower capillary holding portion 17 are the same respectively, as illustrated in FIG. 7(a). Further, as illustrated in FIG. 7(b), the movement amount and movement direction d3 of the upper capillary holding portion 16 and the movement amount and movement direction d4 of the lower capillary holding portion 17 are the same respectively. Accordingly, the capillary 20 is moved horizontally as being kept in a vertical fashion. Further, the movement amount of the capillary 20 at the leading end thereof is the movement amount b1, b2 from the origin position Lc on the plane.

In the above, the first behavior of the capillary using the two piezoelectric elements is described. However, not limited to two, the number of the piezoelectric elements may be one, three, or larger.

[Second Vibration Behavior of Capillary]

Next, description will be provided on a second vibration behavior of the capillary when voltages having waveforms with a phase difference of 180 degrees set therebetween are applied to the piezoelectric elements at the same frequency.

Figure 8:
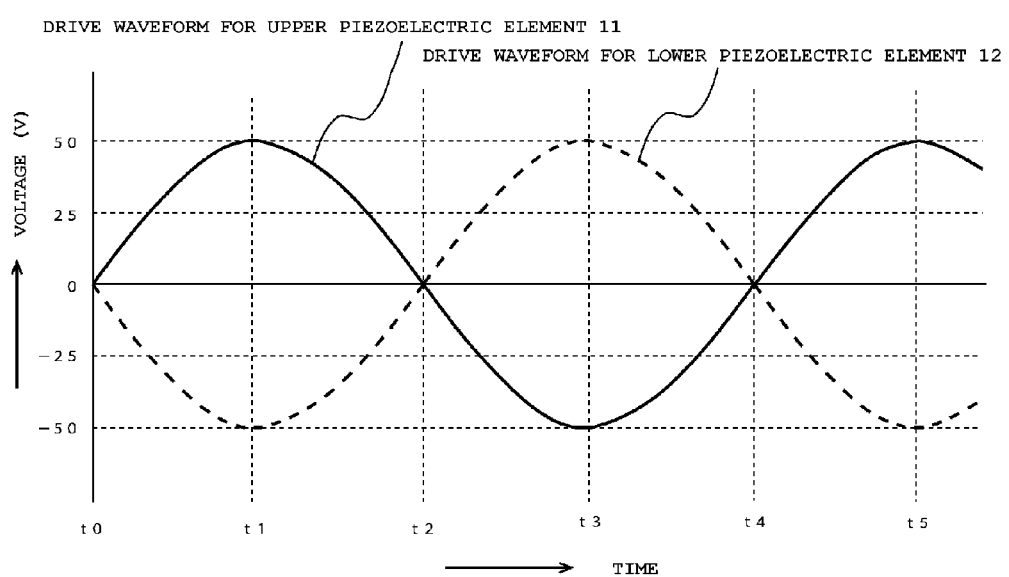
FIG. 8 illustrates voltage waveforms with a phase difference of 180 degrees set therebetween to be applied from the power amplifiers to the piezoelectric elements.

FIG. 8 illustrates voltage waveforms with a phase difference of 180 degrees set therebetween to be applied from the power amplifiers to the piezoelectric elements.

FIG. 9 provides model diagrams describing the second vibration behavior of the capillary. FIG. 9(a) is a model diagram of the vibration behavior when the maximum positive voltage is applied to the upper piezoelectric element and the maximum negative voltage is applied to the lower piezoelectric element. FIG. 9(b) is a model diagram when the maximum negative voltage is applied to the upper piezoelectric element and the maximum positive voltage is applied to the lower piezoelectric element.

As illustrated in FIG. 8, the waveforms of the supply voltages output from the power amplifiers 38, 39 are sine wave voltage waveforms with a phase difference of 180 degrees set therebetween at the same frequency. The high-frequency voltage having a sine waveform indicated by a solid line is applied from the ultrasonic generator 35 to the upper piezoelectric element 11. Further, the high-frequency voltage having a sine waveform indicated by a broken like, the phase of which is shifted by 180 degrees from the sine wave high-frequency voltage applied to the upper piezoelectric element 11 is applied to the lower piezoelectric element 12 from the ultrasonic generator 35.

When the maximum voltages are applied at time t1 in FIG. 8, the upper piezoelectric element 11 operates as being expanded at a vibration face thereof. Then, the capillary is moved in a direction opposite to the bonding arm 3 side via the upper capillary holding portion 16 as indicated by an arrow d5 as illustrated in FIG. 9(a). Further, the lower piezoelectric element 12 operates as being contracted at a vibration face thereof and the capillary is moved toward the bonding arm 3 side via the lower capillary holding portion 17 as indicated by an arrow d6.

On the other hand, when the maximum voltages are applied at time t3 in FIG. 8, the upper piezoelectric element 11 operates as being contracted at the vibration face thereof. Then, the capillary is moved toward the bonding arm 3 side via the upper capillary holding portion 16 as indicated by an arrow d7 as illustrated in FIG. 9(b). Further, the lower piezoelectric element 12 operates as being expanded at the vibration face thereof and the capillary is moved to the side opposite to the bonding arm 3 side via the lower capillary holding portion 17 as indicated by an arrow d8.

Thus, the capillary 20 swings with an arc position where the string-like member 23 and the capillary 20 are in contact with each other (the center S1 of a circle illustrated in FIG. 9) being as a fulcrum point. That is, when the leading end of the capillary 20 at a position lower than the fulcrum s1 swings toward the bonding arm 3 side, the other end of the capillary 20 at the upper side swings to the direction opposite to the leading end of the capillary 20.

Owing to that the upper piezoelectric element and the lower piezoelectric element are driven with the voltage waveforms with a phase difference of 180 degrees set therebetween as illustrated in FIG. 8, the leading end part of the capillary 20 performs an arc (oval) action with the position where the string-like member 23 is in contact with the capillary 20 as being the fulcrum S1 and the origin position Lc as being the center, as illustrated in FIGS. 9(a) and 9(b). The movement amount of the capillary 20 at the leading end at that time is indicated by b3, b4 from the origin position Lc on the plane.

Further, diameter of the arc action can be changed by changing amplitude of the voltage to be applied to the upper piezoelectric element and the lower piezoelectric element.

With such a reversing operation, the amplitude (swing amount) of the capillary at the leading end thereof can be enlarged with the arc action compared to the in-phase operation.

Further, with the reversing operation, the respective piezoelectric elements perform push-pull operation with the position of the string-like member 23 in contact with the capillary 20 being as the fulcrum to cause no extension of the string-like member 23 and prevent variation from occurring at the spring constant of the preliminary pressure. Accordingly, it is possible to further suppress efficiency reduction caused by that the spring characteristic of the preliminary pressure disturbs expansion of the piezoelectric elements.

[Third Vibration Behavior of Capillary]

Figure 10:
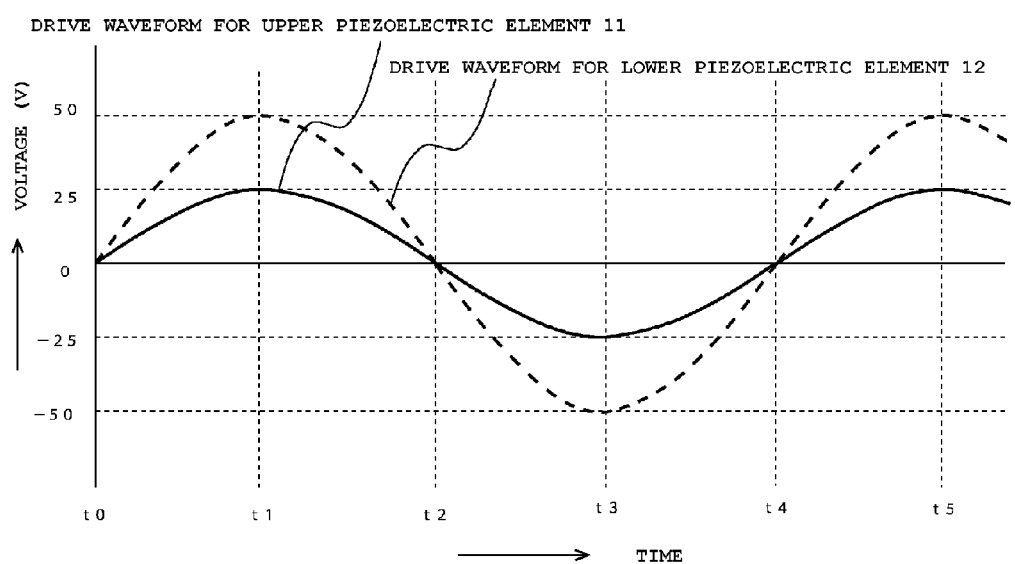
FIG. 10 illustrates voltage waveforms when an amplitude ratio of voltage waveforms of the upper piezoelectric element and the lower piezoelectric element is one to two while the voltage waveforms to be applied to the upper piezoelectric element and the lower piezoelectric element have the same phase.

In the following, description will be provided on a third vibration behavior of the capillary when an amplitude ratio of drive voltage waveforms of the respective piezoelectric elements is varied. FIG. 10 illustrates voltage waveforms when the amplitude ratio of the voltage waveforms of the upper piezoelectric element and the lower piezoelectric element is one to two while the voltage waveforms to be applied to the upper piezoelectric element and the lower piezoelectric element have the same phase.

FIG. 11 provides model diagrams describing the third vibration behavior of the capillary. FIG. 11(a) is a model diagram of the vibration behavior when positive voltages with the amplitude ratio thereof being one to two having the same phase are applied to the upper piezoelectric element and the lower piezoelectric element. FIG. 11(b) is a model diagram of the vibration behavior when negative voltages with the amplitude ratio thereof being one to two having the same phase are applied to the upper piezoelectric element and the lower piezoelectric element.

As illustrated in FIG. 10, the waveforms of the supply voltages output from the power amplifiers 38, 39 are sine wave voltage waveforms having the same phase at the same frequency. The high-frequency voltage having a sine waveform indicated by a solid line with amplitude being a half of the voltage waveform for the lower piezoelectric element 12 is applied from the ultrasonic generator 35 to the upper piezoelectric element 11. Further, the high-frequency voltage having a sine waveform indicated by a broken line with amplitude being two times of the sine waveform to be applied to the upper piezoelectric element 11 is applied from the ultrasonic generator 35 to the lower piezoelectric element 12.

When the maximum voltages are applied at time t1 in FIG. 10, the upper piezoelectric element 11 operates as being expanded at a vibration face thereof as illustrated in FIG. 11(a). Then, the capillary 20 is moved in a direction opposite to the bonding arm 3 side via the upper capillary holding portion 16 as indicated by an arrow d9. Further, the lower piezoelectric element 12 operates as being expanded at a vibration face thereof and the capillary 20 is moved in the direction opposite to the bonding arm 3 side via the lower capillary holding portion 17 as indicated by an arrow d10.

At that time, the movement amount (length of the arrow) of the arrow d10 is two times of the movement amount of the arrow d9. Accordingly, the leading end of the capillary 20 is moved by the movement amount b5 with the uppermost point of the center axis Cc of the capillary 20 being a fulcrum s2.

On the other hand, when the maximum voltages are applied at time t3 in FIG. 10, the upper piezoelectric element 11 operates as being contracted at the vibration face thereof as illustrated in FIG. 11(b). Then, the capillary 20 is moved in a direction toward the bonding arm 3 side via the upper capillary holding portion 16 as indicated by an arrow d11. Further, the lower piezoelectric element 12 operates as being contracted at the vibration face thereof and the capillary 20 is moved in the direction toward the bonding arm 3 side via the lower capillary holding portion 17 as indicated by an arrow d12.

At that time, the movement amount (length of the arrow) of the arrow d12 is two times of the movement amount of the arrow d11. Accordingly, the leading end of the capillary is moved toward the bonding arm 3 side with the uppermost point of the center axis Cc of the capillary being the fulcrum s2. Here, the movement, amount of the leading end of the capillary is b6.

[Fourth Vibration Behavior of Capillary]

Figure 12:
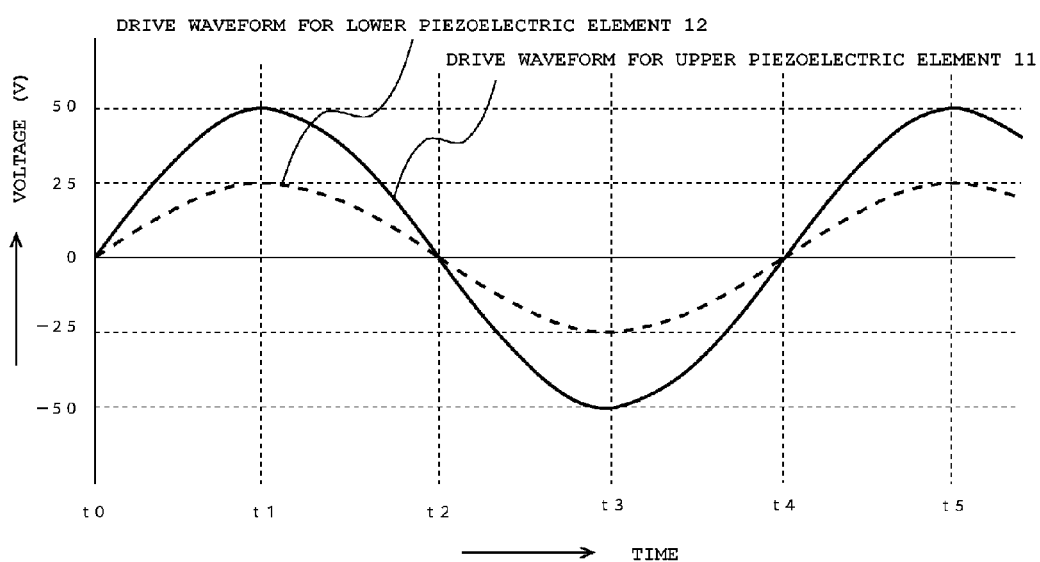
FIG. 12 illustrates voltage waveforms when the amplitude ratio of the voltage waveforms of the upper piezoelectric element and the lower piezoelectric element is two to one while the voltage waveforms to be applied to the upper piezoelectric element and the lower piezoelectric element have the same phase.

Next, description will be provided on a fourth vibration behavior of the capillary with an amplitude ratio being different from the amplitude ratio of the drive voltage waveforms of the respective piezoelectric elements illustrated in FIG. 10. FIG. 12 illustrates voltage waveforms when the amplitude ratio of the voltage waveforms of the upper piezoelectric element and the lower piezoelectric element is two to one while the voltage waveforms to be applied to the upper piezoelectric element and the lower piezoelectric element have the same phase.

FIG. 13 provides model diagrams describing the fourth vibration behavior of the capillary. FIG. 13(a) is a model diagram of the vibration behavior when positive voltages with the amplitude ratio thereof being two to one having the same phase are applied to the upper piezoelectric element and the lower piezoelectric element. FIG. 13(b) is a model diagram of the vibration behavior when negative voltages with the amplitude ratio thereof being two to one having the same phase are applied to the upper piezoelectric element and the lower piezoelectric element.

As illustrated in FIG. 12, the waveforms of the supply voltages output from the power amplifiers 38, 39 are sine wave voltage waveforms having the same phase at the same frequency. The high-frequency voltage having a sine waveform indicated by a solid line with amplitude being two times of the voltage waveform for the lower piezoelectric element 12 is applied from the ultrasonic generator 35 to the upper piezoelectric element 11. Further, the high-frequency voltage having a sine waveform indicated by a broken line with amplitude being a half of the sine waveform to be applied to the upper piezoelectric element 11 is applied from the ultrasonic generator 35 to the lower piezoelectric element 12.

When the maximum voltages are applied at time t1 in FIG. 12, the upper piezoelectric element 11 operates as being expanded at a vibration face thereof as illustrated in FIG. 13(a). Then, the capillary 20 is moved in a direction opposite to the bonding arm 3 side via the upper capillary holding portion 16 as indicated by an arrow d13. Further, the lower piezoelectric element 12 operates as being expanded at a vibration face thereof and the capillary 20 is moved in the direction opposite to the bonding arm 3 side via the lower capillary holding portion 17 as indicated by an arrow d14.

At that time, the movement amount (length of the arrow) of the arrow d14 is a half of the movement amount of the arrow d13. Accordingly, the center axis Cc of the capillary 20 has a fulcrum s3 at the lowermost point of the center axis Cc and the leading end of the capillary 20 is not moved.

On the other hand, when the maximum voltages are applied at time t3 in FIG. 12, the upper piezoelectric element 11 operates as being contracted at the vibration face thereof as illustrated in FIG. 13(b). Then, the capillary 20 is moved in a direction toward the bonding arm 3 side via the upper capillary holding portion 16 as indicated by an arrow d15. Further, the lower piezoelectric element 12 operates as being contracted at the vibration face thereof and the capillary 20 is moved in the direction toward the bonding arm 3 side via the lower capillary holding portion 17 as indicated by an arrow d16.

At that time, the movement amount (length of the arrow) of the arrow d15 is two times of the movement amount of the arrow d16. Accordingly, the center axis Cc of the capillary 20 has a fulcrum s4 at the lowermost point of the center axis Cc and the leading end of the capillary is not moved.

As described above, according to driving of the piezoelectric elements of the bonding device of the present invention, it is possible to cause the capillary to perform a variety of actions. For example, in the in-phase operation of the piezoelectric elements in FIG. 7, the position of a fulcrum of the arc action of the capillary can be varied by varying the amplitude ratio of the drive voltage waveforms of the respective piezoelectric elements.

Further, for example, owing to that the piezoelectric elements are driven with the waveforms illustrated in FIG. 12, it is possible to sweep out foreign matters that disturb bonding from a bonding face with the capillary at the time of bonding.

In the bonding device of the present invention, according to the structure using two piezoelectric elements, it is possible to provide a capillary action for obtaining effects necessary for bonding owing to a variety of functional operation of amplitude, phase, frequency, and/or waveform performed on the drive voltage waveforms of the respective piezoelectric elements. Here, description is provided on the embodiment using the two piezoelectric elements. However, not limited to two, the number of the piezoelectric elements may be three or larger.

[Wire Bonding Device]

Figure 14:
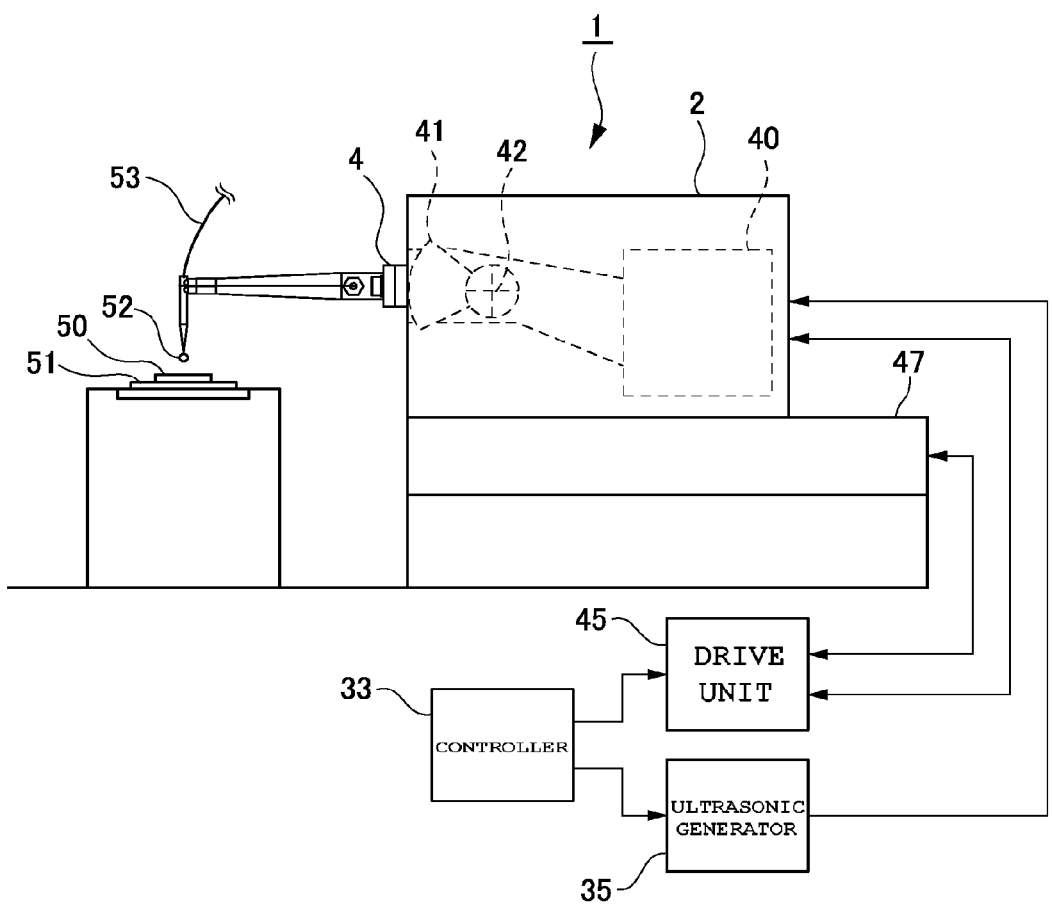
FIG. 14 is a block diagram illustrating a structure of a wire bonding device having a vibration driving portion mounted on a bonding arm.

Next, a wire bonding device having a vibration driving portion mounted on a bonding arm will be described with reference to FIG. 14. FIG. 14 is a block diagram illustrating a structure of the bonding device having the vibration driving portion mounted on the bonding arm.

As illustrated in FIG. 14, the bonding arm 3 of a wire bonding device 1 as the bonding device 1 is attached to a drive arm of a bonding head 2 via the bonding arm attaching portion 4.

The drive arm of the bonding head 2 is provided with a linear motor 40 that vertically swings the bonding arm 3 and an encoder 41 that detects a position of the capillary 20 of the bonding arm 3.

Owing to that a movable portion of the linear motor 40 is vertically moved as being controlled by a drive unit 45, the bonding arm 3 is vertically swung via a support shaft 42. The bonding head 2 is placed on an XY-table 47. Owing to that the XY-table 47 is controlled by the drive unit 45, the capillary 20 of the bonding arm 3 can be located just above a bonding point on a work.

The wire bonding device 1 as the bonding device 1 illustrated in FIG. 14 includes a wire cramp mechanism (not illustrated) that holds a wire 53 at the bonding head 2, a torch lot (not illustrated) for forming a ball at the leading end of the capillary, a wire supply mechanism (not illustrated) that supplies a wire, and the like.

For bonding operation, the capillary 20 is controlled to be located just above a bonding point by the XY-table 47. According to the bonding head 2, the linear motor 40 lowers the bonding arm and the encoder detects whether the leading end of the capillary 20 has touched the bonding point.

Normally, a first bonding point is a pad of a semiconductor element 50 and a second bonding point is a lead of a lead frame 51. A ball 52 to be bonded to the first bonding point or a wire to be bonded to the second bonding point is fed to the leading end of the capillary.

After it is confirmed that the leading end of the capillary 20 has touched the bonding point, by a signal of the encoder 41, a bonding load is applied to the capillary 20 of the bonding arm 3 and the capillary 20 is vibrated by applying the drive voltage to the piezoelectric elements 10 from the ultrasonic generator 35, so that bonding is performed.

The piezoelectric elements 10 are vibrated at the frequency of the drive voltage from the ultrasonic generator 35 and provide ultrasonic vibration with vibration amplitude corresponding to magnitude of the drive voltage. The vibration of the piezoelectric elements 10 is transmitted to the capillary 20 via the capillary holding portions 16, 17.

The bonding load and the ultrasonic vibration are provided to the capillary 20 for a predetermined period of time and bonding at the bonding point is completed.

Not limited to a wire bonding device, the bonding device of the present invention is applicable, for example, to a single point bonding device that performs bonding while a pad of a semiconductor chip and an external leading terminal are overlapped, a bump bonding device that forms a bump with a wire ball on a pad of a semiconductor ship, and the like.

As described above, according to the bonding device of the present invention, a plurality, especially two, of the piezoelectric elements are arranged along the axial direction of the capillary via the capillary holding portions. The two piezoelectric elements expand and contract respectively in a direction perpendicular to the axial direction of the capillary. Owing to separately vibrating the two piezoelectric elements, the leading end of the capillary can be adequately controlled. Accordingly, the bonding device can be used for a variety of bonding components.

Further, according to the bonding device of the present invention, it is possible to vibrate the capillary while inclination of the capillary is corrected during bonding by performing a variety of functional operation of amplitude, phase, frequency, and/or waveform for the voltage waveform to be applied to each of the piezoelectric elements. Accordingly, it is possible to prevent bonding malfunction from occurring at a bonding face between a ball and an electrode of a semiconductor chip.

Further, since the pressing-holding portion that sandwiches the capillary as pressing the capillary to the capillary holding portion is shaped as a string-like member, a tape-shaped member, or a frame member and is formed of a material having small mass and volume, the load to be driven by the piezoelectric element can be lightened. Accordingly, the capillary can be directly driven with improved responsibility.

Further, according to the bonding device of the present invention, at is possible to vary, during bonding, amplitude, phase, frequency of the voltage waveform to be applied to each of the capillaries. For example, it is possible that an oxide film on a surface is eliminated with scrub action at first, and a ball or a wire is bonded with an appropriate vibration behavior of the capillary thereafter.

[Correction of Capillary Inclination]

Next, description will be provided on correction of inclination of the capillary during bonding. The base end side of the capillary is vibrated in accordance with the scrub action by the amount of expansion and contraction being the same as the piezoelectric element along with vibration of the piezoelectric element. In contrast, at the leading end side of the capillary, motion of the capillary is disturbed by the load at the contact face. There may be a case that the disturbance to the motion of the capillary causes the capillary to be inclined.

According to the bonding device of the present invention, the capillary can be vibrated while the inclination thereof is corrected by performing functional operation of amplitude, phase, frequency, and/or waveform for the voltage waveform to be applied to each of the piezoelectric elements.

Figure 17:
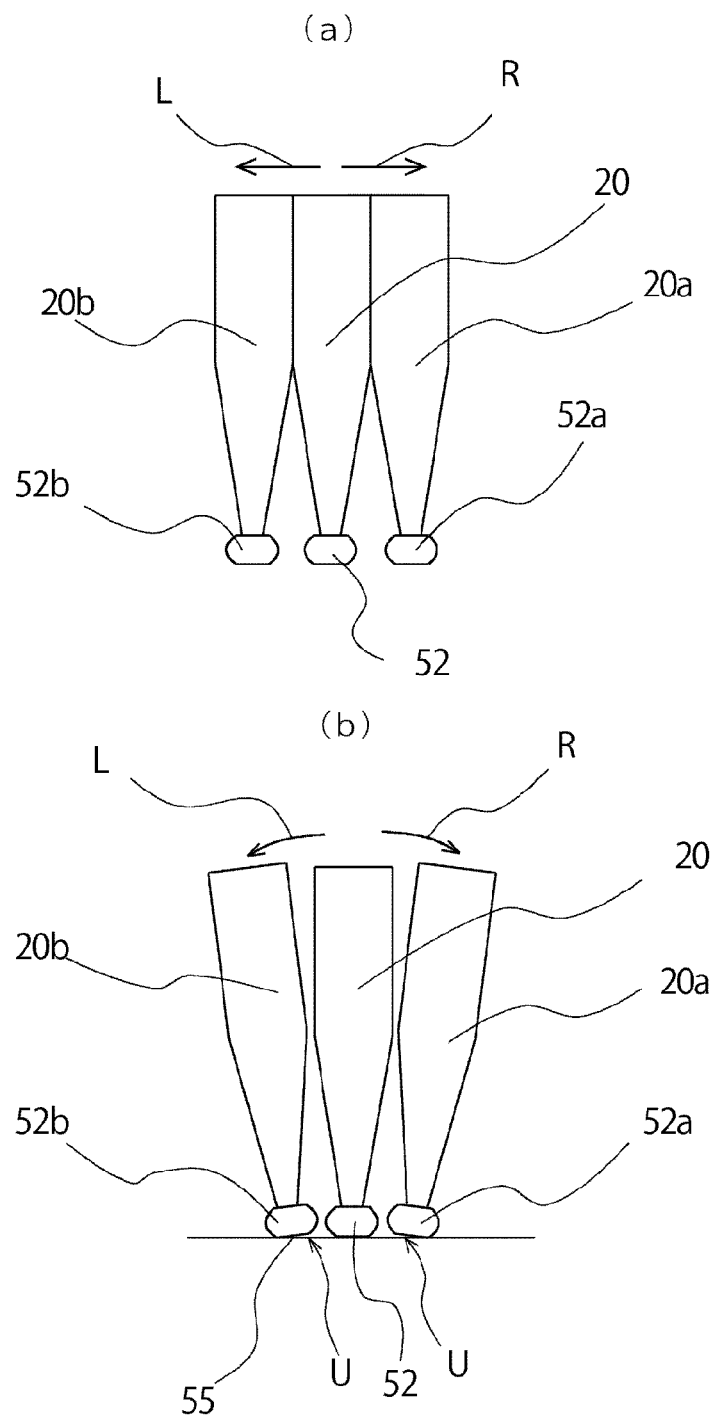

FIG. 17 illustrates inclination of the capillary in accordance with movement of the capillary. FIG. 17(a) illustrates a state of the capillary when the capillary is moved with no load in directions indicated by arrows R, L. FIG. 17(b) illustrates inclination of the capillary during bonding when the capillary is moved in the directions indicated by arrows R, L. Regarding the capillary with no load, for example, when sine wave voltage having the same phase as illustrated in FIG. 5 is applied to the piezoelectric elements, the capillary 20 is moved in the directions indicated by arrows R, L and the center axis of the capillary 20a, 20b is translated at right angle to the plane, as illustrated in FIG. 17(a). Here, the capillary after being translated is denoted by 20a, 20b.

In contrast, regarding the capillary 20 during bonding, in a case that a ball 52a at the leading end of the capillary 20a is pressure-contacted to a bonding face 55 of the semiconductor element 50 (see FIG. 14) and a load is generated thereat when the capillary 20 is moved in the direction indicated by arrow R, the capillary 20a is inclined as not being capable of being moved in a vertical manner, as illustrated in FIG. 17(b). Hereinafter, such inclination of the capillary is expressed as undesirable inclination. When the capillary 20a is inclined with the motion thereof being disturbed by the load at the contact face, the ball 52a located at the leading end of the capillary 20a is inclined as well. Accordingly, as illustrated by a reference U in FIG. 17(b), a gap is generated against the contact face 55 of the ball 52a and unevenness is generated between the ball 52a and the contact face 55 to cause a fear of occurrence of bonding malfunction.

Similarly, in a case that the ball 52b at the leading end of the capillary 20b is pressure-contacted to the bonding face 55 and a load is generated thereat when the capillary 20 is moved in the direction indicated by arrow L, the capillary 20b is inclined as not being capable of being moved in a vertical manner, as illustrated in FIG. 17(b).

Figure 18:
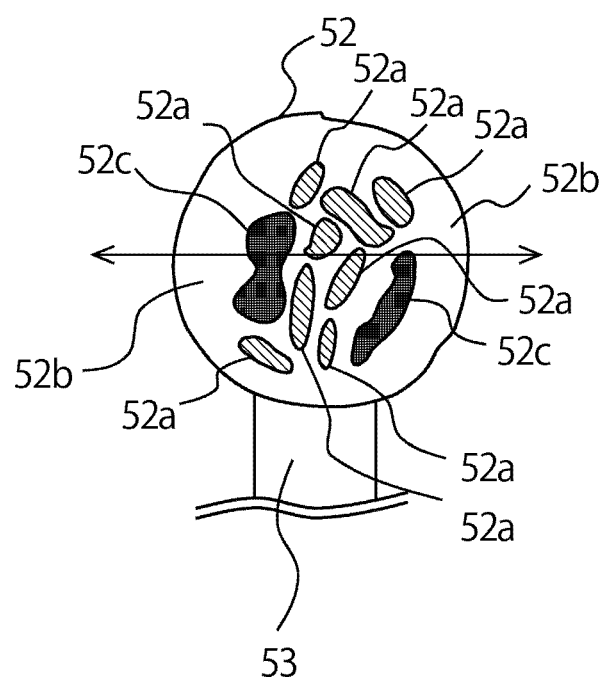
FIG. 18 is a schematic view illustrating a state of a bottom face of a ball when the bottom face of the ball is detached from the bonding face in a case that bonding is performed while sine wave voltage waveforms having the same phase are applied to the upper and lower piezoelectric elements.

FIG. 18 is a schematic view illustrating a state of a bottom face of a ball when the bottom face of the ball is detached from the bonding face in a case that bonding is performed while sine wave voltage waveforms having the same phase are applied to the upper and lower piezoelectric elements. As illustrated in FIG. 18, on the bonding face at the bottom face of the ball 52, non-bonded regions (white regions) 52b exist at both ends of the ball 52 in the vibration direction of the capillary 20 indicated by an arrow and a plurality of narrow bonded regions (shaded regions) 52a are generated. Thus, since even bonded regions 52a are not formed widely, bonding unevenness occurs. Further, dark-color regions at the bottom face of the ball 52 indicate damaged parts 52c at the bonding regions 52a. The damaged parts 52c are generated by excessive bonding such that the ball reaches the inside of the electrode face, and the like. Thus, there may be a case that damage also occurs at the bonded region 52a as illustrated in FIG. 18.

In view of the above, amplitude and phase of driving the respective piezoelectric elements are adjusted to vibrate the capillary with the posture thereof corrected so that the capillary is inclined opposite to the undesirable inclination in advance. Accordingly, the capillary acts as parallel vibration in a state that a load is applied at the contact face. FIG. 19(a) illustrates a state that the posture of the capillary is corrected so that the capillary is inclined in a direction opposite to the capillary illustrated in FIG. 17(a). Here, arrows R, L indicate directions in which the capillary is moved. FIG. 19(b) illustrates a state that the posture of the capillary is corrected so that the capillary is inclined in a direction opposite to the capillary illustrated in FIG. 17(b).

As illustrated in FIG. 19(a), the posture of the capillary 20 is corrected to be inclined in the opposite direction as illustrated as the capillary 20a and the capillary 20a is moved in the direction of arrow R. According to the above, as illustrated in FIG. 19(b), the capillary 20a is to be at right angle to the bonding face 55 after being moved in the direction of arrow R. Similarly, as illustrated in FIG. 19(a), the posture of the capillary 20 is corrected to be inclined in the opposite direction as illustrated as the capillary 20b and the capillary 20b is moved in the direction of arrow L. According to the above, as illustrated in FIG. 19(b), the capillary 20b is to be at right angle to the bonding face 55 after being moved in the direction of arrow L.

Figure 20:
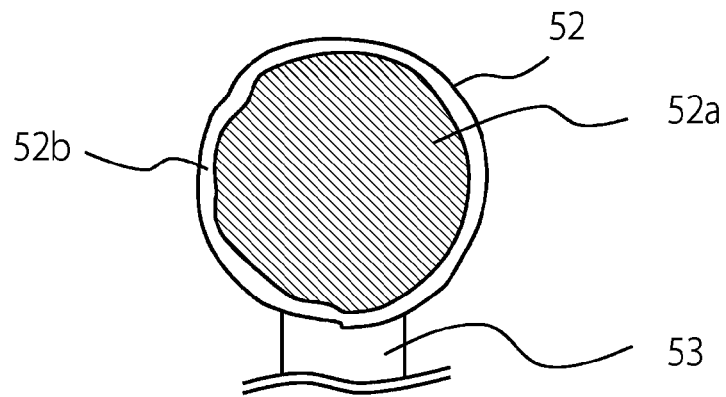
FIG. 20 is a schematic view illustrating a state of a bottom face of a ball when the bottom face of the ball is detached from the bonding face in a case that bonding is performed while the posture of the capillary is corrected so that the capillary is inclined opposite to the undesirable inclination in advance.

FIG. 20 is a schematic view illustrating a state of a bottom face of a ball when the bottom face of the ball is detached from the bonding face in a case that bonding is performed while the posture of the capillary is corrected so that the capillary is inclined opposite to the undesirable inclination in advance. As illustrated in FIG. 20, on the bonding face at the bottom face of the ball 52, although a non-bonded region (white region) 52b appears in the vicinity of outer circumference of the ball 52, a bonded region (shaded region) 52a spreads evenly to the entire ball 52 and bonding unevenness is lessened.

Thus, owing to that the capillary is vibrated with the posture thereof corrected so that the capillary is inclined opposite to the undesirable inclination in advance, the capillary after being moved can be maintained in a vertical manner. Accordingly, no gap is generated against the contact face of the ball and unevenness is not generated on the contact face, so that occurrence of bonding malfunction can be suppressed.

[Second Embodiment of Bonding Device]

Next, a second embodiment of the bonding device of the present invention will be described, with reference to FIGS. 15 and 16.

FIG. 15 illustrates a structure of a vibration driving portion using a string-like member formed in a loop shape. FIG. 15(a) is a plane view and FIG. 15(b) is a side view. FIG. 16 illustrates a state before a lower bonding arm portion is coupled to a lower face of an upper bonding arm portion with bolts. In the second embodiment of the bonding device, the same reference is given to a part similar to that in the first embodiment and description thereof is skipped.

The string-like member illustrated in FIGS. 1 and 2 in the first embodiment of the bonding device is formed to have ends. However, it is also possible to use a string-like member without having ends, that is, formed in an endless shape (in a loop shape), instead of the string-like member having ends. In the following, a vibration driving portion using a string-like member formed in a loop shape in the second embodiment of the bonding device will be described.

Figure 16:
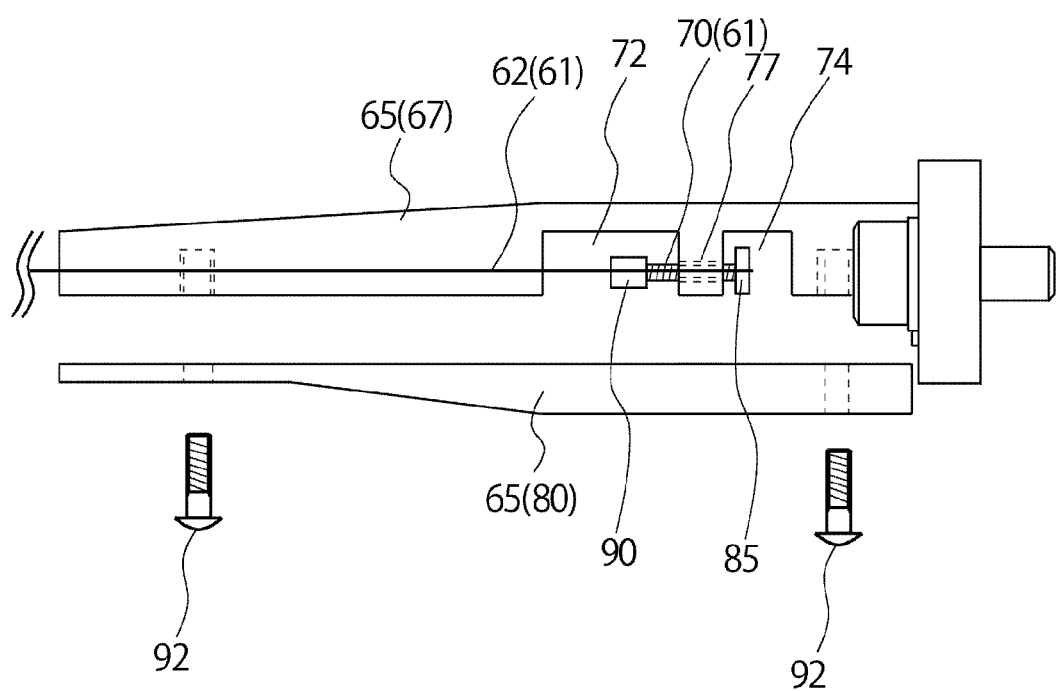
FIG. 16 illustrates a state before a lower bonding arm portion is coupled to a lower face of an upper bonding arm portion with bolts.

As illustrated in FIGS. 15(a), 15(b), and 16, a vibration driving portion 60 includes the piezoelectric element 10, the capillary holding portion 15, a loop-shaped string-like member 62 that fixes the capillary 20 to the capillary holding portion 15 and applies preliminary pressure to the piezoelectric element 10, and a tension mechanism 70 that applies tensile force to the string-like member 62. Here, a pressing-holding portion 61 that presses and holds the capillary 20 to the plurality of capillary holding portions 15 is structured with the string-like member 62 and the tension mechanism 70.

The tension mechanism 70 is arranged in the bonding arm 65 as being perpendicular to the longitudinal direction of the bonding arm 65. The includes a press plate 85, both ends of which are protruded from both side faces of the bonding arm 65, having a side face 85a at one side in the longitudinal direction to which the loop-shaped string-like member 62 is wound and a side face 85b to be pressed at the other side in the longitudinal direction, and a bolt 90 that presses and moves the press plate 85 in the longitudinal direction of the bonding arm 65. Thus, the string-like member 62 forms a loop as being wound to a half circumferential face at the base end side of the capillary 20 on the side opposite to the capillary holding portion 15 and the side face 85a of the press plate 85 in the longitudinal direction.

The bonding arm 65 includes an upper bonding arm portion 67 and a lower bonding arm portion 80. The upper bonding arm portion 67 is provided with a first concave portion 72 and a second concave portion 74 that are formed at a lower face side, and a female thread portion 77 located between the first concave portion 72 and the second concave portion 74. Further, opening portions 73, 75 penetrating respectively to the first concave portion 72 and the second concave portion 74 are formed at an upper face of the upper boding arm portion 67.

The bolt 90 is arranged between the first concave portion 72 and the second concave portion 74 of the upper bonding arm portion via the female thread portion 77. A leading end of the bolt 90 located at the second concave portion 74 is in contact with the side face of the press plate 85. Owing to that the bolt 90 is rotated, the press plate 85 can be moved in the longitudinal direction of the bonding arm 65 with movement of the leading end of the bolt 90. As illustrated in FIG. 15(b), the tension mechanism 70 generates tensile force at the loop-shaped string-like member 62 owing to that a position of the press plate is adjusted by moving the leading end of the bolt 90 in a direction indicated by an arrow. Then, the capillary 20 is pressed and the required preliminary pressure is applied to the piezoelectric element 10 attached to the leading end of the bonding arm 65 via the capillary holding portion 15. Further, the tension mechanism 70 can adjust the preliminary pressure to the capillary 20 by adjusting the position of the press plate.

Further, as illustrated in FIG. 16, after the bolt 90, the press plate 85, and the loop-shaped string-like member 62 are attached to the upper bonding arm portion 67, the lower face of the upper bonding arm portion 67 and the upper face of the lower bonding arm portion 80 are coupled and fixed with fixing bolts 92. Thus, the tension mechanism 70 arranged in the bonding arm 65 is assembled.

[Third Embodiment of Bonding Device]

Next, a third embodiment of the bonding device of the present invention will be described with reference to FIG. 21.

The vibration driving portion 7 illustrated in FIG. 1 can adopt a frame member instead of the string-like member 23. FIG. 21 is a perspective view illustrating a structure of the vibration driving portion that adopts a frame member. Here, regarding the third embodiment of the bonding device, the same reference is given to the same element as the first embodiment and description thereof is not repeated.

Figure 21:
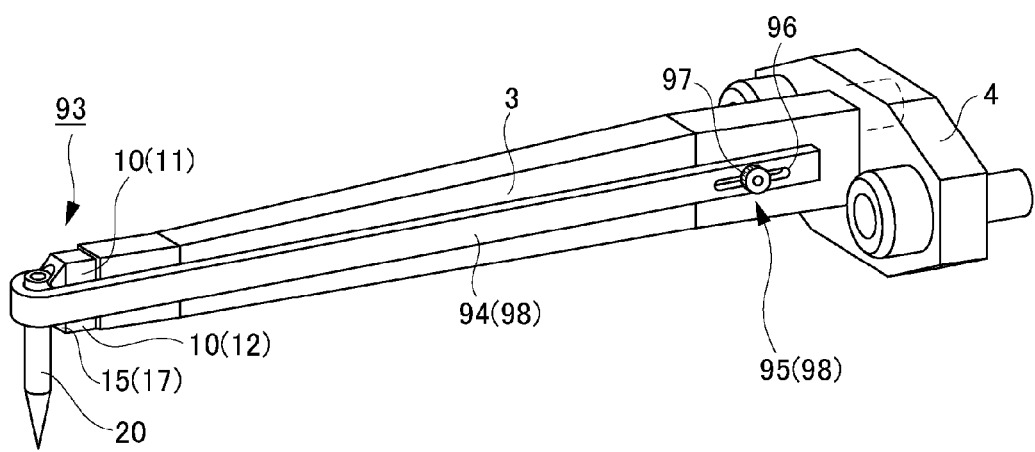
FIG. 21 is a perspective view illustrating a structure of the vibration driving portion that adopts a frame member.

As illustrated in FIG. 21, a vibration driving portion includes the piezoelectric element 10, the capillary holding portion 15, a frame member 94 that fixes the capillary 20 to the capillary holding portion 15 and applies preliminary pressure to the piezoelectric element 10, and a fixing portion 95 that fixed the frame member 94.

The frame member 94 has an approximate U-shape. The fixing portion 95 fixes the frame member 94 to a side face of the bonding arm 3 via a bolt 97 through an elongated hole 96 formed at the frame member 94.

Here, a pressing-holding portion 98 that sandwiches the capillary 20 as pressing the capillary 20 to the capillary holding portions 15 is structured with the frame member 94 and the fixing portion 95. Similarly to the tension mechanisms of the first embodiment and the second embodiment, the preliminary pressure to the capillary 20 can be adjusted by adjusting a fastening position of the bolt 97 to the elongated hole 96.

The present invention can be actualized in a variety of forms without departing from substantial characteristics thereof. Therefore, the abovementioned embodiments are only for explanation and are not intended to limit the present invention.

EXPLANATION OF REFERENCES

1 Bonding device (Wire bonding device)
2 Bonding head
3 Bonding arm
4 Bonding arm attaching portion
7 Vibration driving portion
10 Piezoelectric element
11 Upper piezoelectric element (First piezoelectric element)
12 Lower piezoelectric element (Second piezoelectric element)
14 Capillary holding portion
15a Concave portion (Curved face)
16 Upper capillary holding portion
17 Lower capillary holding portion
20 Capillary 21 Pressing-holding portion
23 String-like member
25 Tension mechanism
26 Rod-shaped member
33 Controller
35 Ultrasonic generator
36 Waveform generator
38, 39 Power amplifier
40 Linear motor
41 Encoder
42 Support shaft
45 Drive unit
47 XY-table
50 Semiconductor element
51 Lead frame
52 Ball
52a Bonded region
52b Non-bonded region
52c Damaged part
53 Wire
55 Bonding face
60 Vibration driving portion
61 Pressing-holding portion
62 String-like member
65 Bonding arm
67 Upper bonding arm portion
70 Tension mechanism
72 First concave portion
73 Opening portion
74 Second concave portion
75 Opening portion
77 Female thread portion
80 Lower bonding arm portion
85 Press plate
90 Bolt
92 Fixing bolt
93 Vibration driving portion
94 Frame member
95 Fixing portion
96 Elongated hole
97 Bolt
98 Pressing-holding portion

The invention claimed is:

1. A bonding device that includes a vibration driving portion to vibrate a capillary, the vibration driving portion comprising:
   a plurality of piezoelectric elements that are expanded and contracted along an axial direction of a bonding arm respectively with one end thereof fixed to a leading end of the bonding arm;
   a plurality of capillary holding portions that are in contact respectively with a circumferential face of the capillary at a base end side thereof as being fixed correspondingly to the other end of the piezoelectric elements; and
   a pressing-holding portion that sandwiches the capillary as pressing the capillary to the capillary holding portions with at least one end side fixed to the bonding arm and the other end side being in contact with the circumferential face of the capillary at the base end side thereof on a side opposite to the capillary holding portions.

2. The bonding device according to claim 1, wherein the vibration driving portion operates without utilizing resonance.

3. The bonding device according to claim 1, wherein the piezoelectric elements are arranged along the axial direction of the capillary.

4. The bonding device according to claim 1, wherein the piezoelectric elements are two piezoelectric elements that are arranged along the axial direction of the capillary, the two piezoelectric elements being a first piezoelectric element and a second piezoelectric element arranged below the first piezoelectric element.

5. The bonding device according to claim 4, wherein voltage waveforms having the same phase are applied to the first piezoelectric element and the second piezoelectric element.

6. The bonding device according to claim 4, wherein voltage waveforms with a phase difference of 180 degrees set therebetween at the same frequency are applied to the first piezoelectric element and the second piezoelectric element.

7. The bonding device according to claim 4, wherein voltage waveforms to be applied to the first piezoelectric element and the second piezoelectric element have the same phase and an amplitude ratio of the voltage waveforms for the first piezoelectric element and the second piezoelectric element is different.

8. The bonding device according to claim 1, wherein the piezoelectric elements are capable of causing the capillary to perform operation required for bonding owing to that functional operation of amplitude, phase, frequency, or waveform is performed on drive voltage waveforms to be applied to the respective piezoelectric elements.

9. The bonding device according to claim 1, wherein the capillary is vibrated while inclination of the capillary caused by a leading end of the capillary being pulled with a load at a contact face of the capillary is corrected by performing functional operation of amplitude, phase, frequency, or waveform on a drive voltage waveform to each of the piezoelectric elements.

10. The bonding device according to claim 1, wherein the pressing-holding portion is a string member, a tape member, or a frame member.

11. The bonding device according to claim 1, wherein the bonding device is a wire bonding device.

12. The bonding device according to claim 5, wherein amplitude of voltages to be applied to the first piezoelectric element and the second piezoelectric element can be varied.

13. The bonding device according to claim 6, wherein amplitude of voltages to be applied to the first piezoelectric element and the second piezoelectric element can be varied.

* * * * *